US012765223B2

(12) United States Patent
Shin et al.

(10) Patent No.: US 12,765,223 B2
(45) Date of Patent: Oct. 13, 2026

(54) DISPLAY DEVICE INCLUDING BANK LAYER TIPS

(71) Applicant: Samsung Display Co., LTD., Yongin-si (KR)

(72) Inventors: Hyun Eok Shin, Yongin-si (KR); Sung Joo Kwon, Yongin-si (KR); Ju Hyun Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 470 days.

(21) Appl. No.: 18/218,043

(22) Filed: Jul. 4, 2023

(65) Prior Publication Data

US 2024/0122031 A1 Apr. 11, 2024

(30) Foreign Application Priority Data

Oct. 11, 2022 (KR) ........................ 10-2022-0130094
Dec. 21, 2022 (KR) ........................ 10-2022-0181159

(51) Int. Cl.
*H10K 59/80* (2023.01)
*H10K 59/12* (2023.01)
(Continued)

(52) U.S. Cl.
CPC ... *H10K 59/80516* (2023.02); *H10K 59/1201* (2023.02); *H10K 59/122* (2023.02);
(Continued)

(58) Field of Classification Search
CPC ........... H10K 59/80516; H10K 59/122; H10K 59/38; H10K 59/873; H10K 59/8792;
(Continued)

(56) References Cited

U.S. PATENT DOCUMENTS 5,952,037 A * 9/1999 Nagayama ........... H10K 59/127 427/404
6,060,728 A * 5/2000 Ghosh .................. H10K 59/173 257/94
(Continued)

FOREIGN PATENT DOCUMENTS

JP 2005268024 A * 9/2005 ............. H10K 50/17
JP 2008135325 A * 6/2008 ....... H10K 59/80522
KR 20200102025 A * 8/2020

OTHER PUBLICATIONS

Extended European Search Report—European Application No. 23199236.3 dated Mar. 6, 2024.

*Primary Examiner* — Ida M Soward
(74) *Attorney, Agent, or Firm* — CANTOR COLBURN LLP

(57) ABSTRACT

A display device include first and second pixel electrodes apart from each other on a substrate, an inorganic insulating layer in part on the first and second pixel electrodes, a bank structure on the inorganic insulating layer with first and second openings defined therethrough to overlap the first and second pixel electrodes, an auxiliary layer on the first and second pixel electrodes in the first and second openings, first and second light-emitting layers on the auxiliary layer on the first and second pixel electrodes, first and second common electrodes on the first and second light-emitting layers, and an auxiliary layer pattern on the bank structure around the first and second openings. The bank structure includes first and second bank layers including different metal materials, and the second bank layer includes tips protruding from side surfaces of the first bank layer defining the first and second openings.

14 Claims, 20 Drawing Sheets

(51) Int. Cl.

| | |
|---|---|
| ***H10K 59/122*** | (2023.01) |
| ***H10K 59/38*** | (2023.01) |
| *H10K 50/844* | (2023.01) |
| *H10K 50/86* | (2023.01) |
| *H10K 59/124* | (2023.01) |
| *H10K 59/126* | (2023.01) |
| *H10K 59/40* | (2023.01) |
| *H10K 102/00* | (2023.01) |

(52) U.S. Cl.
CPC ........... *H10K 59/38* (2023.02); *H10K 59/873* (2023.02); *H10K 59/8792* (2023.02); *H10K 50/844* (2023.02); *H10K 50/865* (2023.02); *H10K 59/12* (2023.02); *H10K 59/124* (2023.02); *H10K 59/126* (2023.02); *H10K 59/40* (2023.02); *H10K 2102/341* (2023.02)

(58) Field of Classification Search
CPC .. H10K 59/8731; H10K 59/35; H10K 59/124; H10K 59/12; H10K 59/40; H10K 59/126; H10K 50/17; H10K 50/865; H10K 50/844
See application file for complete search history.

(56) References Cited

U.S. PATENT DOCUMENTS

| | | | | |
|---|---|---|---|---|
| 6,069,443 | A * | 5/2000 | Jones | H10K 59/173 313/506 |
| 10,861,911 | B2 * | 12/2020 | Kim | H10K 59/122 |
| 11,527,732 | B1 * | 12/2022 | Chen | H10K 30/82 |
| 11,610,954 | B1 * | 3/2023 | Lin | H10K 59/122 |
| 2007/0231596 | A1 | 10/2007 | Spindler et al. | |
| 2009/0009069 | A1 * | 1/2009 | Takata | H10K 59/122 445/24 |
| 2012/0205634 | A1 * | 8/2012 | Ikeda | H10K 50/813 257/40 |
| 2016/0172421 | A1 * | 6/2016 | Ando | H10K 59/122 438/34 |
| 2021/0020714 | A1 * | 1/2021 | Lee | G06F 3/0412 |
| 2021/0167146 | A1 * | 6/2021 | Yang | H10K 59/30 |
| 2021/0335943 | A1 * | 10/2021 | Song | H10K 59/1275 |
| 2022/0077251 | A1 * | 3/2022 | Choung | H10K 59/873 |

* cited by examiner

DISPLAY DEVICE INCLUDING BANK LAYER TIPS

This application claims priority to Korean Patent Application No. 10-2022-0130094, filed on Oct. 11, 2022, and Korean Patent Application No. 10-2022-0181159, filed on Dec. 21, 2022, and all the benefits accruing therefrom under 35 U.S.C. § 119, the contents of which in their entireties are herein incorporated by reference.

BACKGROUND

1. Field

The disclosure relates to a display device and a method of fabricating the same.

2. Description of the Related Art

As the information society has developed, display devices for displaying images are widely used in various fields. For example, display devices have been applied to various electronic devices such as smart phones, digital cameras, notebook computers, navigation systems, and smart televisions. Here, the display devices may be flat panel display devices such as a liquid crystal display (LCD) device, a field emission display (FED) device, or an organic light-emitting diode (OLED) display device. Light-emitting display devices, among such flat panel display devices, include light-emitting elements capable of allowing the pixels of a display device to emit light to display an image without using a backlight unit for providing light to the display panel.

SUMMARY

Embodiments of the disclosure provide a display device capable of preventing changes in the pixel-electrode characteristics of light-emitting elements that may occur during manufacture, and a method of fabricating the display device.

According to an embodiment of the disclosure, a display device includes a first pixel electrode and a second pixel electrode which are disposed on a substrate to be spaced apart from each other, an inorganic insulating layer disposed on the substrate to be in part on the first and second pixel electrodes, a bank structure disposed on the inorganic insulating layer, where first and second openings are defined through the bank structure to overlap the first and second pixel electrodes, respectively, an auxiliary layer disposed on the first and second pixel electrodes in the first and second openings, a first light-emitting layer and a second light-emitting layer which are disposed on the auxiliary layer on the first pixel electrode and the second pixel electrode, respectively, a first common electrode and a second common electrode which are disposed on the first light-emitting layer and the second light-emitting layer, respectively, and an auxiliary layer pattern disposed on the bank structure around the first opening and the second opening, where the bank structure includes a first bank layer and a second bank layer, which is disposed on the first bank layer and includes a different metal material from the first bank layer, and the second bank layer includes tips, which protrude from side surfaces of the first bank layer defining the first opening and the second opening.

In an embodiment, each of the auxiliary layer and the auxiliary layer pattern may include tungsten oxide (WOx).

In an embodiment, each of the auxiliary layer and the auxiliary layer pattern may include tantalum oxide (TaOx).

In an embodiment, each of the auxiliary layer and the auxiliary layer pattern may have a TaOx content in a range of about 5 weight percent (wt %) to about 12 wt %.

In an embodiment, each of the auxiliary layer and the auxiliary layer pattern may do not include indium tin oxide (ITO).

In an embodiment, the auxiliary layer may be in contact with top surfaces of the first pixel electrode and the second pixel electrode.

In an embodiment, the auxiliary layer may be disposed at least in part on the inorganic insulating layer and be partially in contact with the side surfaces of the first bank layer.

In an embodiment, the auxiliary layer pattern may be disposed to surround the tips of the second bank layer and be at least partially in contact with the side surfaces of the first bank layer.

In an embodiment, the first bank layer may include aluminum (Al), and the second bank layer may include titanium (Ti).

In an embodiment, the first common electrode and the second common electrode may be in direct contact with the side surfaces of the first bank layer.

In an embodiment, the display device may further include a first organic pattern disposed on the auxiliary layer pattern to surround the first opening and including a same material as the first light-emitting layer, a first electrode pattern disposed on the first organic pattern and including a same material as the first common electrode, a second organic pattern disposed on the auxiliary layer pattern to surround the second opening and including the same material as the second light-emitting layer, and a second electrode pattern disposed on the second organic pattern and including a same material as the second common electrode.

In an embodiment, the display device may further include a first inorganic layer disposed on a side surface of the bank structure defining the first opening and on the first common electrode and the first electrode pattern, and a second inorganic layer disposed on a side surface of the bank structure defining the second opening and on the second common electrode and the second electrode pattern, where the first and second inorganic layers may be spaced apart from each other, and part of the second bank layer may do not overlap the first and second inorganic layers.

In an embodiment, the display device may further include a thin-film encapsulation layer disposed on the bank structure, where the thin-film encapsulation layer may include a first encapsulation layer, a second encapsulation layer, which is disposed on the first encapsulation layer, and a third encapsulation layer, which is disposed on the second encapsulation layer.

In an embodiment, the display device may further include a light-blocking layer disposed on the third encapsulation layer, where a plurality of opening holes may be defined through the light-blocking layer to overlap the first opening and the second opening, and a first color filter and a second color filter which are disposed on the light-blocking layer and overlap the first opening and the second opening, respectively.

According to an embodiment of the disclosure, a method of fabricating a display device, includes forming a plurality of pixel electrodes, which are spaced apart from one another, an inorganic insulating layer, which is disposed on the pixel electrodes, and a first bank material layer and a second bank material layer, which are disposed on the inorganic insulating layer, on a substrate, forming a first hole, which overlaps one of the pixel electrodes and exposes a part of a top surface of a corresponding pixel electrode among the pixel electrodes through the inorganic insulating layer, the first bank material layer and the second bank material layer, forming tips in the second bank material layer, which protrude from side surfaces of the first bank material layer, by wet-etching side surfaces defining the first hole, forming an auxiliary layer on the second bank material layer and on the pixel electrode in a first opening, which is obtained by the wet-etching the side surfaces defining the first hole, forming a light-emitting layer and a common electrode on the auxiliary layer and in the first opening, and forming an inorganic layer on the auxiliary layer and on the second bank material layer; and removing a part of the inorganic layer on the second bank material layer.

In an embodiment, the auxiliary layer may include tungsten oxide (WOx) and tantalum oxide (TaOx).

In an embodiment, the auxiliary layer may have a TaOx content in a range of about 5 wt % to about 12 wt %.

In an embodiment, the auxiliary layer may be in direct contact with the top surface of the corresponding pixel electrode in the first opening, the light-emitting layer may be disposed directly on the auxiliary layer and in the first opening, and the common electrode may be in direct contact with the side surfaces of the first bank material layer.

In an embodiment, the first bank material layer may include aluminum (Al), and the second bank material layer may include titanium (Ti).

In an embodiment, the forming the light-emitting layer and the common electrode, may include forming an organic pattern, which is disposed on the auxiliary layer and includes a same material as the light-emitting layer, and an electrode pattern, which includes a same material as the common electrode, on the second bank material layer, and the inorganic layer may be disposed on the electrode pattern.

According to embodiments of the disclosure, as a display device includes an auxiliary layer on pixel electrodes, which compensates for changes in electrical properties of the pixel electrodes that may be caused by damage to the pixel electrodes during etching, such that the characteristics of light-emitting elements can be maintained without providing a sacrificial layer for preventing damage to the pixel electrodes.

BRIEF DESCRIPTION OF THE DRAWINGS

The above and other features of embodiments of the disclosure will become more apparent by describing in detail embodiments thereof with reference to the accompanying drawings, in which.

DETAILED DESCRIPTION

Figure 1:
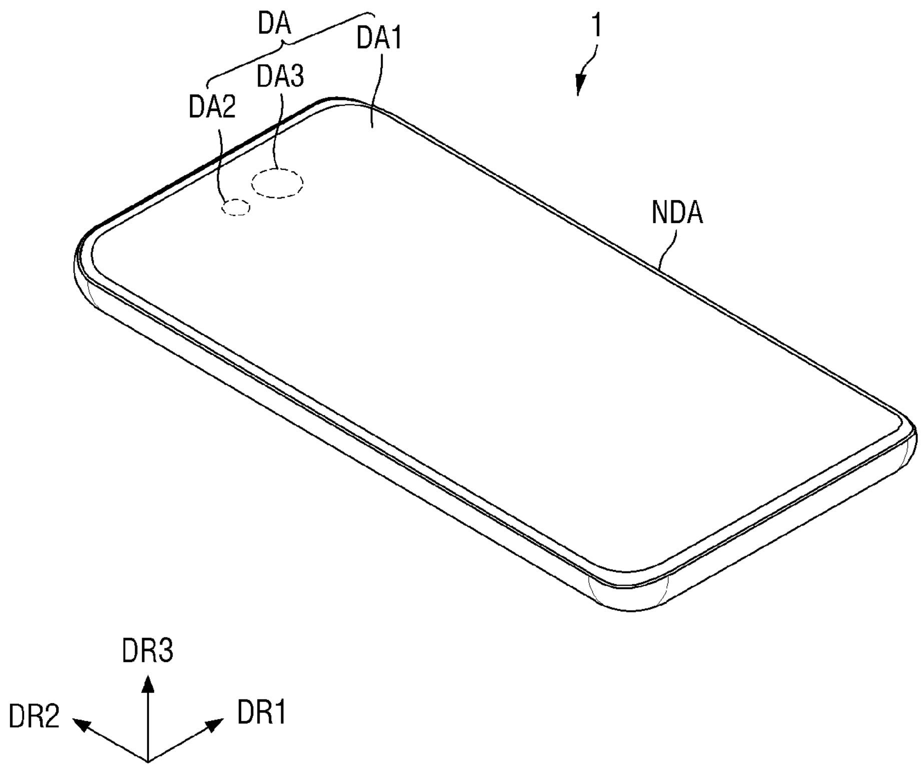
FIG. 1 is a perspective view of an electronic device according to an embodiment of the disclosure.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

FIG. 1 is a perspective view of an electronic device according to an embodiment of the disclosure.

Referring to FIG. 1, an embodiment of an electronic device 1 displays a moving image or a still image. The electronic device 1 may refer to all types of electronic devices provided with a display screen, for example, a television (TV), a notebook computer, a monitor, an electronic billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book reader, a portable multimedia player (PMP), a navigation device, a gaming console, a digital camera, and a camcorder.

Figure 2:
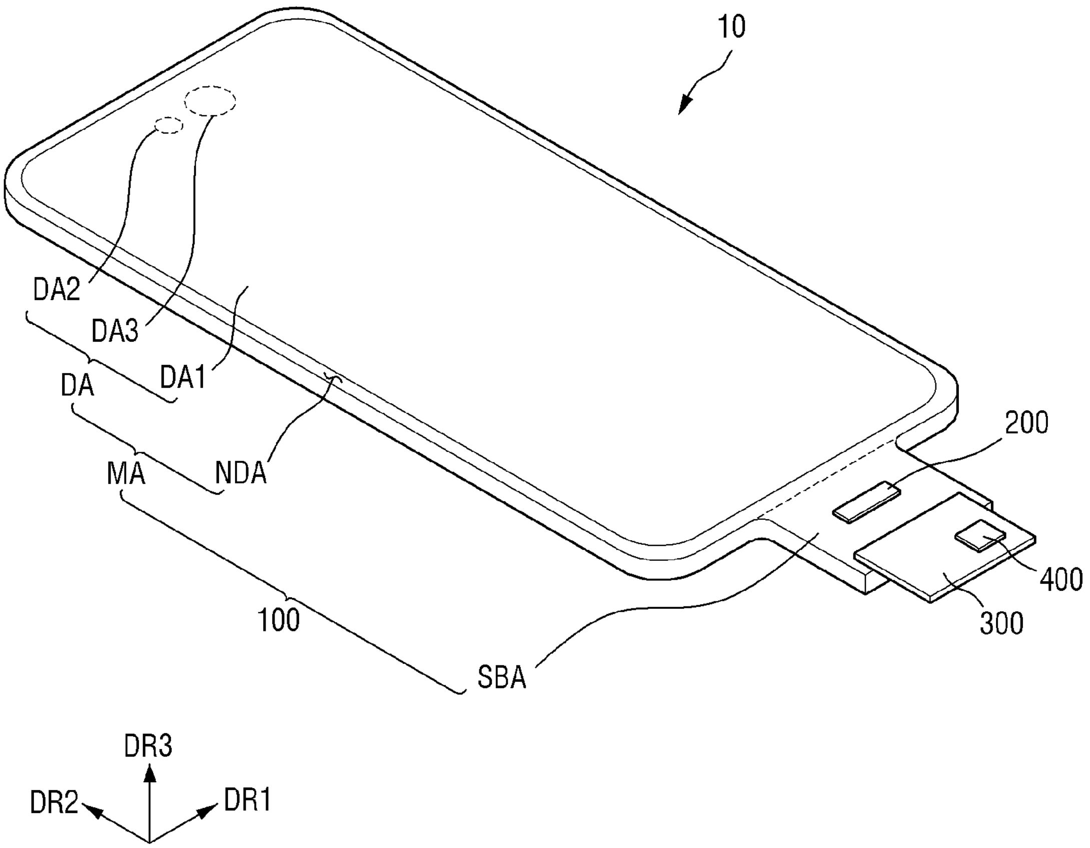
FIG. 2 is a perspective view of a display device included in the electronic device according to an embodiment of the disclosure.

In an embodiment, the electronic device 1 may include a display device 10 of FIG. 2. In such an embodiment, the display device 10 may be an inorganic light-emitting diode display device, an organic light-emitting diode (OLED) display device, a quantum-dot light-emitting display device, a plasma display device, or a field emission display (FED) device. Hereinafter, embodiments where the display device 10 is an OLED display device will be described as an example, but the disclosure is not limited thereto. Alternatively, the display device 10 may also be applicable to various other display devices.

The shape of the electronic device 1 may be variously modified. In an embodiment, for example, the electronic device 1 may have a rectangular shape that extends longer horizontally than vertically, a rectangular shape that extends longer vertically than horizontally, a square shape, a rectangular shape with rounded corners, another polygonal shape, or a circular shape. A display area DA of the electronic device 1 may generally have a similar shape to the electronic device 1. FIG. 1 illustrates an embodiment where the electronic device 1 has a rectangular shape that extends longer in a second direction DR2 than in a first direction DR1.

The electronic device 1 may include a display area DA and a non-display area NDA. The display area DA may be an area where an image can be displayed, and the non-display area NDA may be an area where an image is not displayed. The display area DA may also be referred to as an active area, and the non-display area NDA may also be referred to as an inactive area. The display area DA may be generally defined by a middle portion of the electronic device 1.

The display area DA may include first, second, and third display areas DA1, DA2, and DA3. The second and third display areas DA2 and DA3 may be component areas where components for adding various functions are disposed.

FIG. 2 is a perspective view of a display device included in the electronic device of FIG. 1.

Referring to FIG. 2, the electronic device 1 of FIG. 1 may include the display device 10. In an embodiment, the display device 10 may provide a display screen for the electronic device 1. The display device 10 may have a similar shape to the electronic device 1. In an embodiment, for example, the display device 10 may have an almost rectangular shape having short sides extending in the first direction DR1 and long sides extending in the second direction DR1. The corners where the short sides and the long sides of the display device 10 meet may be rounded to have a predetermined curvature or may be right-angled. The shape of the display device 10 is not particularly limited, and the display device 10 may be formed in another one of various other shapes such as another polygonal shape, a circular shape, or an elliptical shape.

The display device 10 may include a display panel 100, a display driving unit 200, a circuit board 300, and a touch driving unit 400.

The display panel 100 may include a main area MA and a subarea SBA.

The main area MA may include a display area DA, which includes pixels for displaying an image, and a non-display area NDA, which is disposed around the display area DA. The display area DA may include the first, second, and third display areas DA1, DA2, and DA3. The display area DA may emit light through a plurality of emission areas or openings. In an embodiment, for example, the display panel 100 may include pixel circuits including switching elements, a pixel-defining film defining the emission areas or the openings, and self-light-emitting elements.

In an embodiment, for example, the self-light-emitting elements may include organic light-emitting diodes (OLEDs), quantum-dot light-emitting diodes (LEDs) including a quantum-II) dot light-emitting layer, inorganic LEDs including an inorganic semiconductor, and/or micro-LEDs, but the disclosure is not limited thereto.

The non-display area NDA may be on the outside of the display area DA. The non-display area NDA may be defined as an edge part of the main area MA. The non-display area NDA may include a gate driving unit (not illustrated) for providing gate signals to gate lines and fan-out lines (not illustrated) connected between the display driving unit 200 and the display area DA.

The subarea SBA may be an area extending from one side of the main area MA. The subarea SBA may include a flexible material that is bendable, foldable, or rollable. In an embodiment, for example, where the subarea SBA is bendable, the subarea SBA may be bent to overlap the main area MA in a thickness direction (or a third direction DR3). The subarea SBA may include the display driving unit 200 and a pad unit, which is connected to the circuit board 300. Alternatively, the subarea SBA may not be provided, and the display driving unit 200 and the pad unit may be disposed in the non-display area NDA.

The display driving unit 200 may output signals and voltages for driving the display panel 100. The display driving unit 200 may provide data voltages to data lines. The display driving unit 200 may provide power supply voltages to power supply lines and may provide gate control signals to the gate driving unit. The display driving unit 200 may be formed as an integrated circuit (IC) and may be mounted on the display panel 100 in a chip-on-glass (COG) or chip-on-plastic (COP) manner or via ultrasonic bonding. In an embodiment, for example, the display driving unit 200 may be disposed in the subarea SBA and may overlap the main area MA in the thickness direction when the subarea SBA is bent. In an alternative embodiment, for example, the display driving unit 200 may be mounted on the circuit board 300.

The circuit board 300 may be attached to the pad unit of the display panel 100 via an anisotropic conductive film (ACF). Lead lines of the circuit board 300 may be electrically connected to the pad unit of the display panel 100. The circuit board 300 may be a printed circuit board (PCB), a flexible PCB (FPCB), or a flexible film such as a chip-on-film (COF).

The touch driving unit 400 may be mounted on the circuit board 300. The touch driving unit 400 may be electrically connected to a touch sensing unit of the display panel 100. The touch driving unit 400 may provide a touch driving signal to a plurality of touch electrodes of the touch sensing unit and may sense capacitance variations between the touch electrodes. In an embodiment, for example, the touch driving signal may be a pulse signal having a predetermined frequency. The touch driving unit 400 may calculate the presence and coordinates of input (e.g., a touch event) based on the capacitance variations between the touch electrodes. The touch driving unit 400 may be formed as an integrated circuit (IC).

Figure 3:
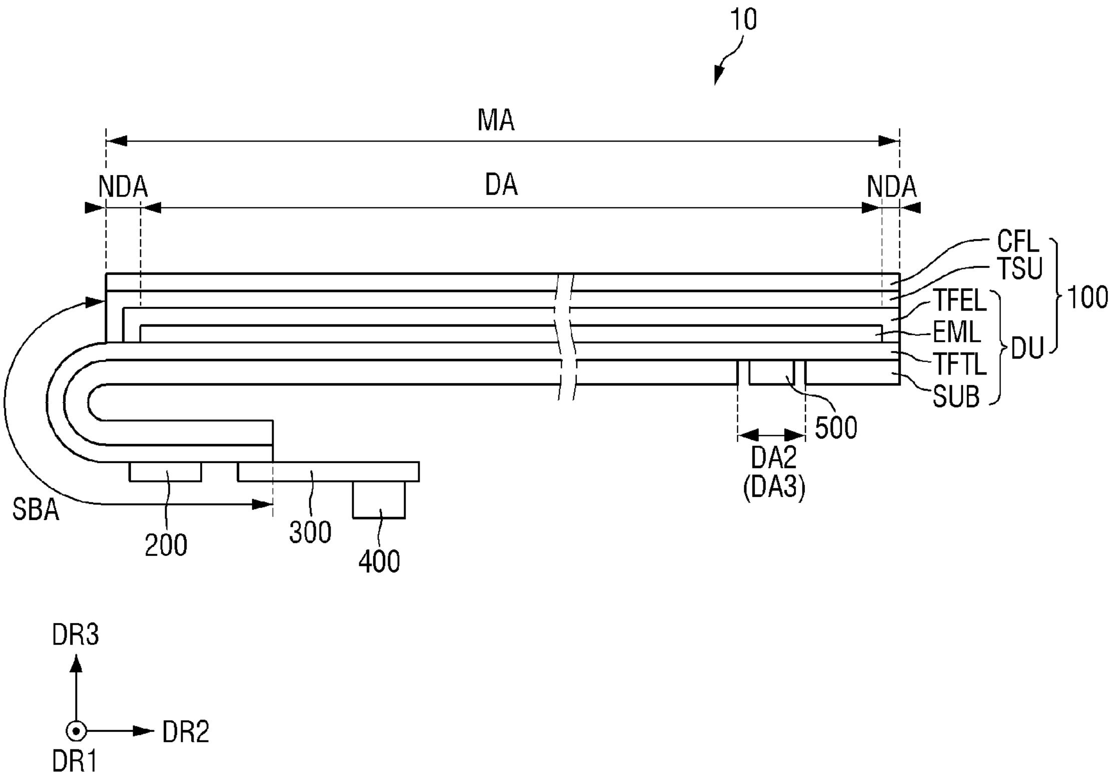
FIG. 3 is a cross-sectional view of the display device of FIG. 2.

FIG. 3 is a cross-sectional view of the display device of FIG. 2.

Referring to FIG. 3, an embodiment of the display panel 100 may include a display layer DU, a touch sensing layer TSU, and a color filer layer CFL. The display layer DU may include a substrate SUB, a thin-film transistor (TFT) layer TFTL, a light-emitting element layer EML, and a thin-film encapsulation layer TFEL.

The substrate SUB may be a base substrate or a base member. The substrate SUB may be a flexible substrate that is bendable, foldable, or rollable. In an embodiment, for example, the substrate SUB may include a polymer resin such as polyimide (PI), but the disclosure is not limited thereto. In an alternative embodiment, for example, the substrate SUB may include a glass material or a metal material.

The TFT layer TFTL may be disposed on the substrate SUB. The TFT layer TFTL may include a plurality of TFTs that form the pixel circuitry of pixels. The TFT layer TFTL may further include gate lines, data lines, power lines, gate control lines, and fan-out lines connecting the display driving unit 200 and the data lines to each other, and lead lines connecting the display driving unit 200 and the pad unit to each other. The TFTs may include semiconductor regions, source electrodes, drain electrodes, and gate electrodes. In an embodiment, for example, where the gate driving unit is formed on one side of the non-display area NDA of the display panel 100, the gate driving unit may include TFTs.

The TFT layer TFTL may be disposed in the display area DA, the non-display area NDA, and the subarea SBA. The TFTs, the gate lines, the data lines, and the power lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include a plurality of light-emitting elements, which include first electrodes, second electrodes, light-emitting layers and emit light, and a pixel-defining film, which defines the pixels. The light-emitting elements of the light-emitting element layer EML may be disposed in the display area DA.

The light-emitting layers may be organic light-emitting layers including an organic material. The light-emitting layers may include hole transport layers, organic light-emitting layers, and electron transport layers. As the first electrodes receive a voltage through the TFTs of the TFT layer TFTL and the second electrodes receive a cathode voltage, holes and electrons may move to the organic emission layers through the hole transport layers and the electron transport layers, respectively, and may combine together in the organic light-emitting layers to emit light.

Alternatively, the light-emitting elements may be quantum-dot LEDs including quantum-dot light-emitting layers, inorganic LEDs including an inorganic semiconductor, or micro-LEDs.

The display device 10 may include a plurality of color filters ("CF1", "CF2", and "CF3" of FIGS. 5 and 6), which are disposed on the light-emitting elements of the light-emitting element layer EML. Each of the color filters may selectively transmit light of a particular wavelength therethrough and may block or absorb light of other wavelengths. The color filters may absorb some of external light and may thus reduce reflected light of the external light.

Accordingly, the color filters effectively prevents color distortions that may be caused by the reflection of external light. As the color filters are disposed on the light-emitting elements, the display device 10 may not include a separate substrate for the color filters, and thus, the thickness of the display device 10 can be reduced.

The thin film-encapsulation layer TFEL may cover the top surface and sides of the light-emitting element layer EML and may protect the light-emitting element layer EML. The thin film-encapsulation layer TFEL may include at least one inorganic film and at least one organic film for encapsulating the light-emitting element layer EML.

The touch sensing layer TSU may be disposed on the thin-film encapsulation layer TFEL. The touch sensing layer TSU may include a plurality of touch electrodes for detecting touch input from a user in a capacitive manner and touch lines for connecting the touch electrodes and the touch driving unit 400. In an embodiment, for example, the touch sensing layer TSU may sense touch input from the user in a mutual capacitance manner or in a self-capacitance manner.

Alternatively, in some embodiments, the touch sensing layer TSU may be disposed on a separate substrate on the display layer DU. In such embodiment, the substrate supporting the touch sensing layer TSU may be a base member for encapsulating the display layer DU.

The touch electrodes of the touch sensing layer TSU may be disposed in a touch sensor area, which overlaps with the display area DA. The touch lines of the touch sensing layer TSU may be disposed in a touch peripheral area, which overlaps with the non-display area NDA.

In some embodiments, the display device 10 may further include an optical device 500. The optical device 500 may be disposed in (or to overlap) the second or third display area DA2 or DA3. The optical device 500 may emit or receive infrared light, ultraviolet light, or visible light. In an embodiment, for example, the optical device 500 may be an optical sensor capable of sensing light incident upon the display device 10, such as a proximity sensor, a light sensor, a camera sensor, or an image sensor.

The color filter layer CFL may be disposed on the thin film-encapsulation layer TFEL. The color filter layer CFL may include a plurality of color filters, which correspond to a plurality of emission areas. Each of the color filters may selectively transmit light of a particular wavelength therethrough and may block or absorb light of other wavelengths. The color filter layer CFL may absorb some of light introduced into the display device 10 from the outside and may thus reduce reflected light of external light. Accordingly, the color filter layer CFL can prevent any color distortions that may be caused by the reflection of external light.

In an embodiment where the color filter layer CFL is disposed directly on the thin film-encapsulation layer TFEL, the display device 10 may not include a separate substrate for the color filter layer CFL. Accordingly, the thickness of the display device 10 may be relatively small.

Figure 4:
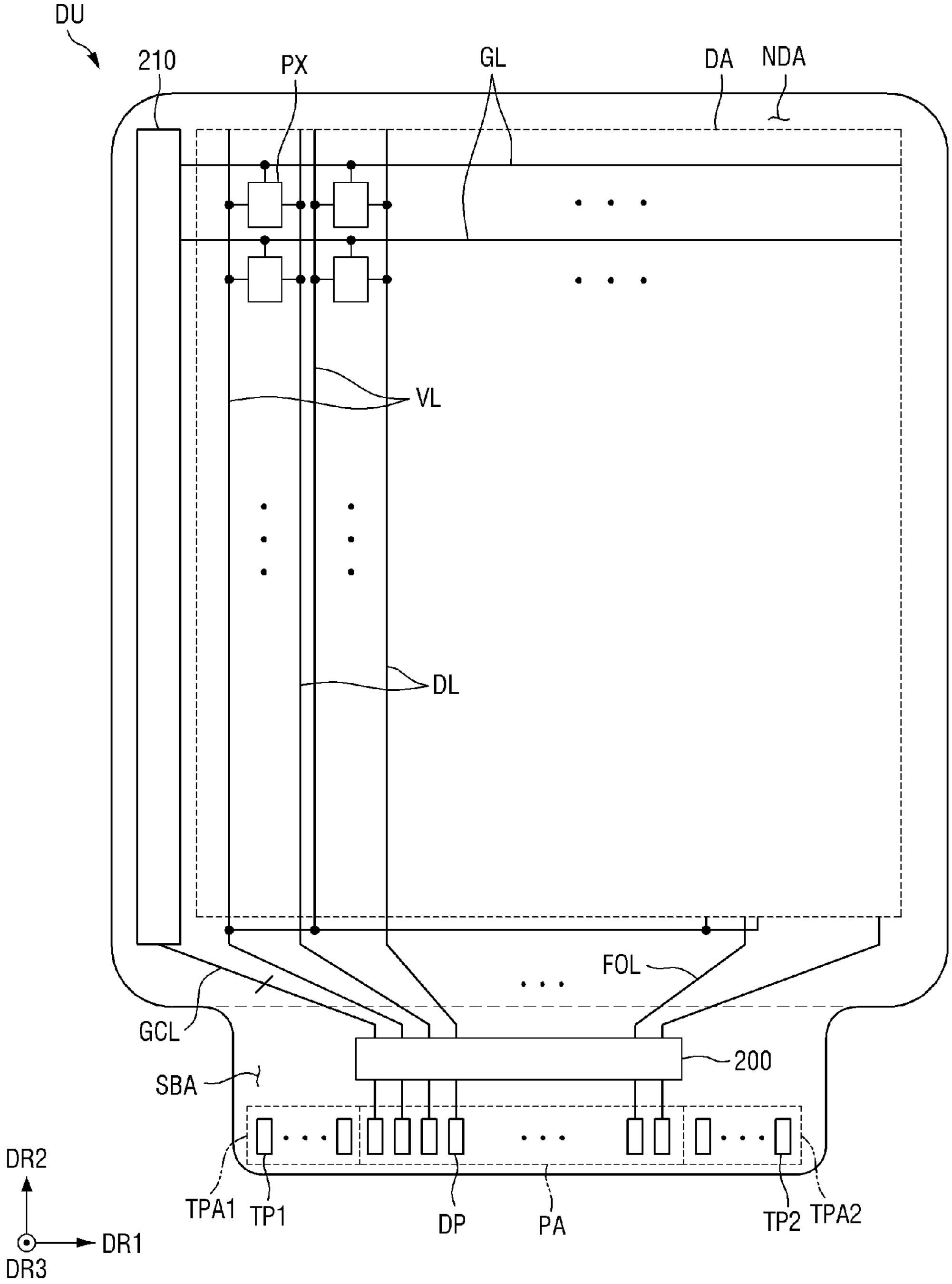
FIG. 4 is a plan view of a display layer of the display device of FIG. 2.

FIG. 4 is a plan view of the display layer of the display device of FIG. 2.

Referring to FIG. 4, an embodiment of the display layer DU may include the display area DA and the non-display area NDA.

The display area DA may be disposed (or defined) in the middle of the display panel 100. A plurality of pixels PX, a plurality of gate lines GL, a plurality of data lines DL, and a plurality of power supply lines VL may be disposed in the display area DA. The pixels PX may be defined as basic units for emitting light.

The gate lines GL may provide gate signals received from the gate driving unit 210 to the pixels PX. The gate lines GL may extend in the first direction DR1 and may be spaced apart from one another in the second direction DR2, which intersects the first direction DR1.

The data lines DL may provide data voltages received from the display driving unit 200 to the pixels PX. The data lines DL may extend in the second direction DR2 and may be spaced apart from one another in the first direction DR1.

The power supply lines VL may provide the power supply voltages received from the display driving unit 200 to the pixels PX. Here, the power supply voltages include a driving voltage, an initialization voltage, a reference voltage, and/or a low-potential voltage. The power supply lines VL may extend in the second direction DR2 and may be spaced apart from one another in the first direction DR1.

The non-display area NDA may surround the display area DA. The gate driving unit 210, fan-out lines FOL, and gate control lines CGL may be disposed in the non-display area NDA.

The gate driving unit 210 may generate a plurality of gate signals based on the gate control signals and may sequentially provide the gate signals to the gate lines GL in a predefined order.

The fan-out lines FOL may extend from the display driving unit 200 to the display area DA. The fan-out lines FOL may provide data voltages received from the display driving unit 200 to the data lines DL.

The gate control lines CGL may extend from the display driving unit 200 to the gate driving unit 210. The gate control lines GCL may provide gate control signals received from the display driving unit 200 to the gate driving unit 210.

The subarea SBA may include the display driving unit 200, a pad area PA, and first and second touch areas TPA1 and TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the pixels PX and may control the luminance of the pixels PX. The display driving unit 200 may provide gate control signals to the gate driving unit 210 through the gate control lines GCL.

The pad area PA, the first touch pad area TPA1, and the second touch pad area TPA2 may be disposed on an edge of the subarea SBA. The pad area PA, the first touch pad area TPA1, and the second touch pad area TPA2 may be electrically connected to the circuit board 300 via an anisotropic conductive film (ACF) or a self-assembly anisotropic conductive paste (SAP).

The pad area PA may include a plurality of display pads DP. The display pads DP may be connected to a graphics system via the circuit board 300. The display pads DP may be connected to the circuit board 300 and may thus receive digital video data and provide the digital video data to the display driving unit 200.

Figure 5:
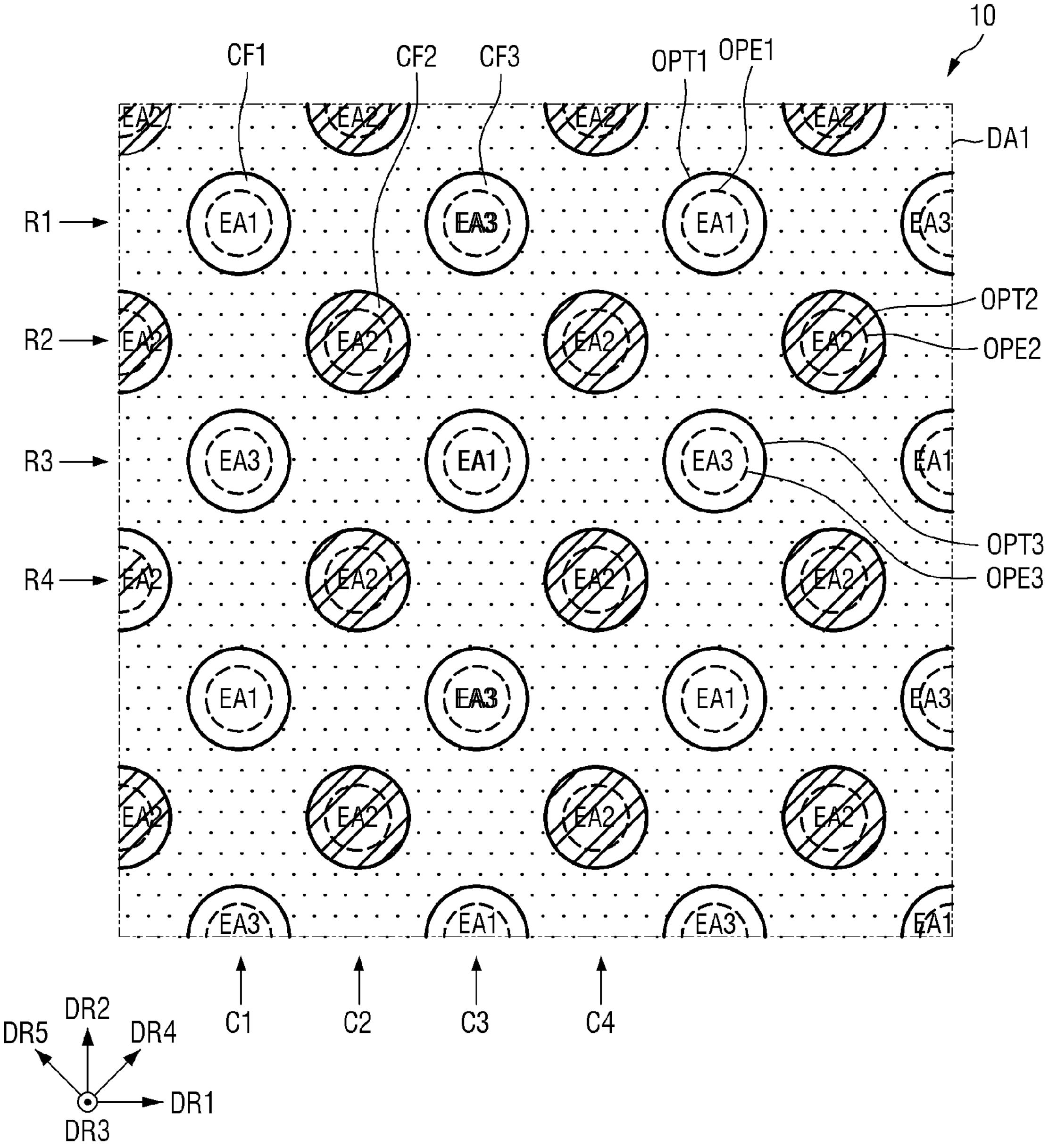
FIG. 5 is a plan view illustrating an arrangement of emission areas and color filters in a display area of the display device of FIG. 2.

FIG. 5 is a plan view illustrating an arrangement of emission areas and color filters in the display area of the display device of FIG. 2.

Referring to FIG. 5, an embodiment of the display device 10 may include a plurality of emission areas (EA1, EA2, and EA3), which are disposed in the display area DA. The display area DA of FIG. 3 is the first display area DA1, and the emission areas (EA1, EA2, and EA3) may be disposed in the first display area DA1. The emission areas (EA1, EA2, and EA3) may also be disposed in the second and third display areas DA2 and DA2.

The emission areas (EA1, EA2, and EA3) may include first emission areas EA1, second emission areas EA2, and third emission areas EA3, which emit light of different colors from each other. The first emission areas EA1, the second emission areas EA2, and the third emission areas EA3 may emit red light, green light, and blue light, respectively, and the colors of beams of light emitted from the emission areas (EA1, EA2, and EA3) may vary depending on the types of light-emitting elements ("ED1", "ED2", and "ED3" of FIG. 6) disposed in the light-emitting element layer EML. In an embodiment, for example, the first emission areas EA1 may emit first light, which is red light, the second emission areas EA2 may emit second light, which is green light, and the third emission areas EA3 may emit third light, which is blue light. However, the disclosure is not limited to this example.

The emission areas (EA1, EA2, and EA3) may be arranged in a PenTile™ manner, for example, in a diamond PenTile™ manner. In an embodiment, for example, the first emission areas EA1 and the third emission areas EA3 may be spaced apart from one another in the first direction DR1 and may be alternately arranged in the first and second directions DR1 and DR2. In first and third rows R1 and R3, the first emission areas EA1 and the third emission areas EA3 may be alternately arranged in the first direction DR1, and in first and third columns C1 and C3, the first emission areas EA1 and the third emission areas EA3 may be alternately arranged in the second direction DR2.

The second emission areas EA2 may be spaced apart from one another in the first and second directions DR1 and DR2 and may be spaced apart from the first emission areas EA1 and the third emission areas EA3 in a fourth direction DR4 or a fifth direction DR5. The second emission areas EA2 may be repeatedly arranged in the first and second directions DR1 and DR2, and the second emission areas EA2 and the first emission areas EA1, or the second emission areas EA2 and the third emission areas EA3, may be alternately arranged in the fourth direction DR4 or the fifth direction DR5. In second and fourth rows R2 and R4, the second emission areas EA2 may be repeatedly arranged in the first direction DR1, and in second and fourth columns C2 and C4, the second emission areas EA2 may be repeatedly arranged in the second direction DR2.

The first emission areas EA1, the second emission areas EA2, and the third emission areas EA3 may be defined by a plurality of openings (OPE1, OPE2, and OPE3), which are defined or formed in a bank structure ("BNS" of FIG. 6) of the light-emitting element layer EML. In an embodiment, for example, the first emission areas EA1 may be defined by first openings OPE1 of a pixel-defining film, the second emission areas EA2 may be defined by second openings OPE2 of the pixel-defining film, and the third emission areas EA3 may be defined by third openings OPE3 of the pixel-defining film.

The size of the emission areas (EA1, EA2, and EA3) may vary depending on the size of the openings (OPE1, OPE2, and OPE3) of the bank structure. The intensity of light emitted from the emission areas (EA1, EA2, and EA3) may vary depending on the size of the emission areas (EA1, EA2, and EA3), and the color of a screen displayed by the display device 10 or the electronic device 1 may be controlled by controlling the size of the emission areas (EA1, EA2, and EA3). The first, second, and third emission areas EA1, EA2, and EA3 may have the same size. In an embodiment of FIG. 6, the first, second, and third emission areas EA1, EA2, and EA3 may have a same size or diameter as each other.

However, the disclosure is not limited to those described above. In an embodiment, the size of the emission areas (EA1, EA2, and EA3) may be controlled or modified freely in accordance with a screen color required of the display device 10 or the electronic device 1. The size of the emission areas (EA1, EA2, and EA3) may be associated with the efficiency and the life of the light-emitting elements (ED1, ED2, and ED3) and may be in a tradeoff relationship with the reflection of external light. The size of the emission areas (EA1, EA2, and EA3) may be controlled or determined in consideration of all the above. In an embodiment, for example, the third emission areas EA3 may be larger in size than the first emission areas EA1 and the second emission areas EA2, and the first emission areas EA1 may be larger in size than the second emission areas EA2.

In an embodiment of FIG. 5, one first emission area EA1, two second emission areas EA2, and one third emission area EA3 may form one pixel group. Each pixel group may include emission areas (EA1, EA2, and EA3) that emit light of different colors from each other and may thus be able to display white gradation, but the disclosure is not limited thereto. The combination of emission areas (EA1, EA2, and EA3) forming each pixel group may vary depending on the layout of the emission areas (EA1, EA2, and EA3) and the colors of beams of light emitted from the emission areas (EA1, EA2, and EA3).

The display device 10 may include a plurality of color filters (CF1, CF2, and CF3), which are disposed in the emission areas (EA1, EA2, and EA3). The color filters (CF1, CF2, and CF3) may be disposed to correspond to the emission areas (EA1, EA2, and EA3). In an embodiment, for example, the color filters (CF1, CF2, and CF3) may be disposed in a plurality of opening holes (OPT1, OPT2, and OPT3) of a light-blocking layer BM, which are disposed to correspond to the emission areas (EA1, EA2, and EA3) or the openings (OPE1, OPE2, and OPE3). The opening holes (OPT1, OPT2, and OPT3) of the light-blocking layer BM may be defined or formed to overlap the openings (OPE1, OPE2, and OPE3) and may form light-output areas that output light emitted from the emission areas (EA1, EA2, and EA3). The color filters (CF1, CF2, and CF3) may have a larger area than the openings (OPE1, OPE2, and OPE3) and may completely cover the light-output areas formed by the opening holes (OPT1, OPT2, and OPT3) of the light-blocking layer BM.

The color filters (CF1, CF2, and CF3) may include first color filters CF1, second color filters CF2, and third color filters CF3, which are disposed to correspond to different emission areas (EA1, EA2, and EA3). The color filters (CF1, CF2, and CF3) may include a pigment or dye capable of absorbing light of all wavelength ranges except for a particular wavelength range and may be disposed to correspond to the colors of beams of light emitted from the emission areas (EA1, EA2, and EA3). In an embodiment, for example, the first color filters CF1 may be disposed to overlap the first emission areas EA1 and may be red color filters capable of transmitting only the first light, which is red light, therethrough. In an embodiment, for example, the second colors filter CF2 may be disposed to overlap the second emission areas EA2 and may be green color filters capable of transmitting only the second light, which is green light, therethrough, and the third color filters CF3 may be disposed to overlap the third emission areas EA3 and may be blue color filters capable of transmitting only the third light, which is blue light, therethrough.

The color filters (CF1, CF2, and CF3), like the emission areas (EA1, EA2, and EA3), may be arranged in a PenTile' manner, for example, in a diamond PenTile' manner. In an embodiment, for example, the first color filters CF1 and the third color filters CF3 may be alternately arranged in the first and second directions DR1 and DR2. In first and third rows R1 and R3, the first color filters CF1 and the third color filters CF3 may be alternately arranged in the first direction DR1, and in first and third columns C1 and C3, the first color filters CF1 and the third color filters CF3 may be alternately arranged in the second direction DR2.

The second color filters CF2 may be spaced apart from one another in the first and second directions DR1 and DR2 and may be spaced apart from the first color filters CF1 and the third color filters CF3 in the fourth direction DR4 or the second direction DR5. The second color filters CF2 may be repeatedly arranged in the first and second directions DR1 and DR2, and the second color filters CF2 and the first color filters CF1, or the second color filters CF2 and the third color filters CF2, may be alternately arranged in the fourth direction DR4 or the fifth direction DR5. In second and fourth rows R2 and R4, the second color filters CF2 may be repeatedly arranged in the first direction DR1, and in second and fourth columns C2 and C4, the second color filters CF2 may be repeatedly arranged in the second direction DR2.

Figure 6:
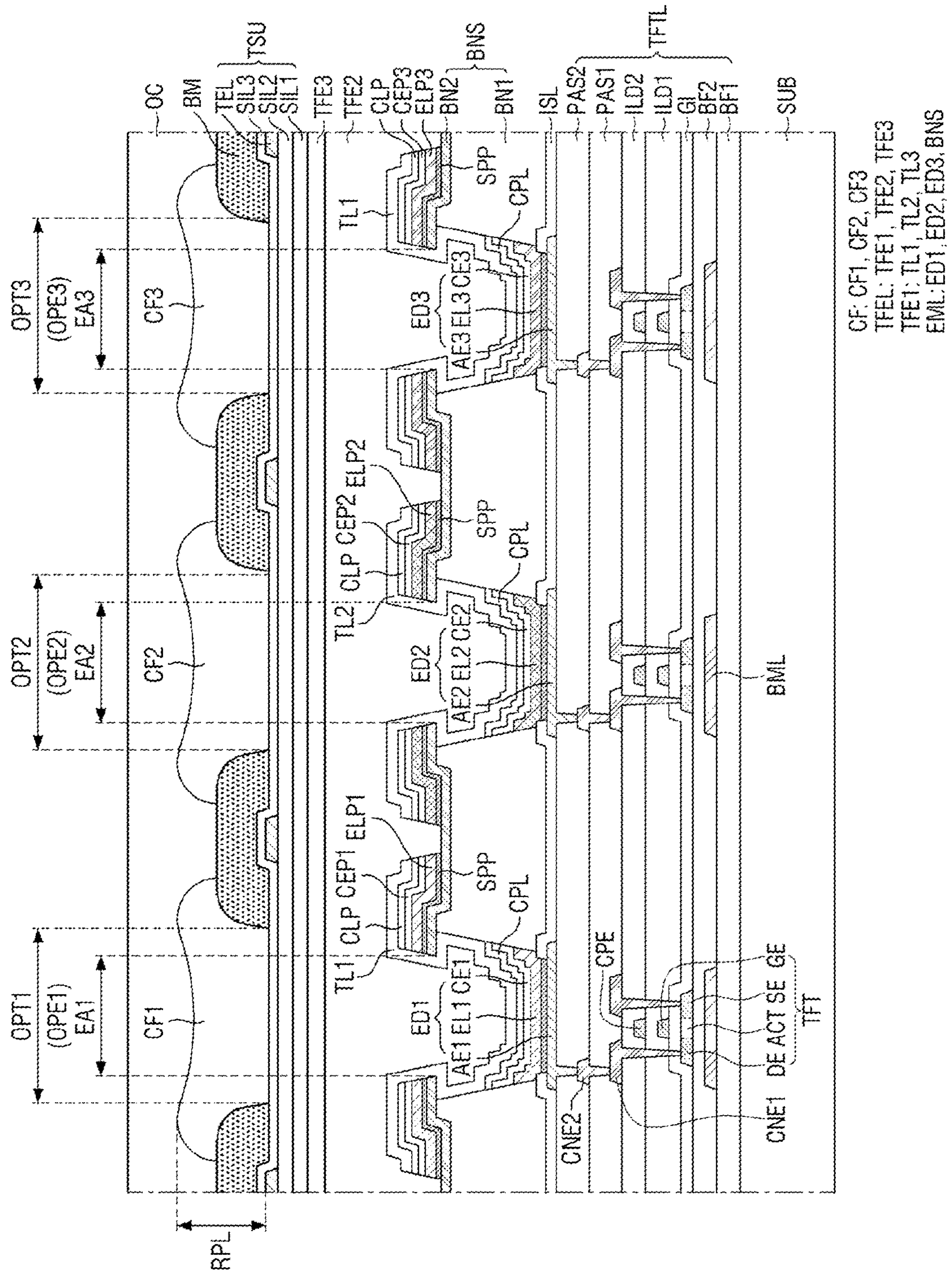
FIG. 6 is a cross-sectional view of part of the display device of FIG. 2.
Figure 7:
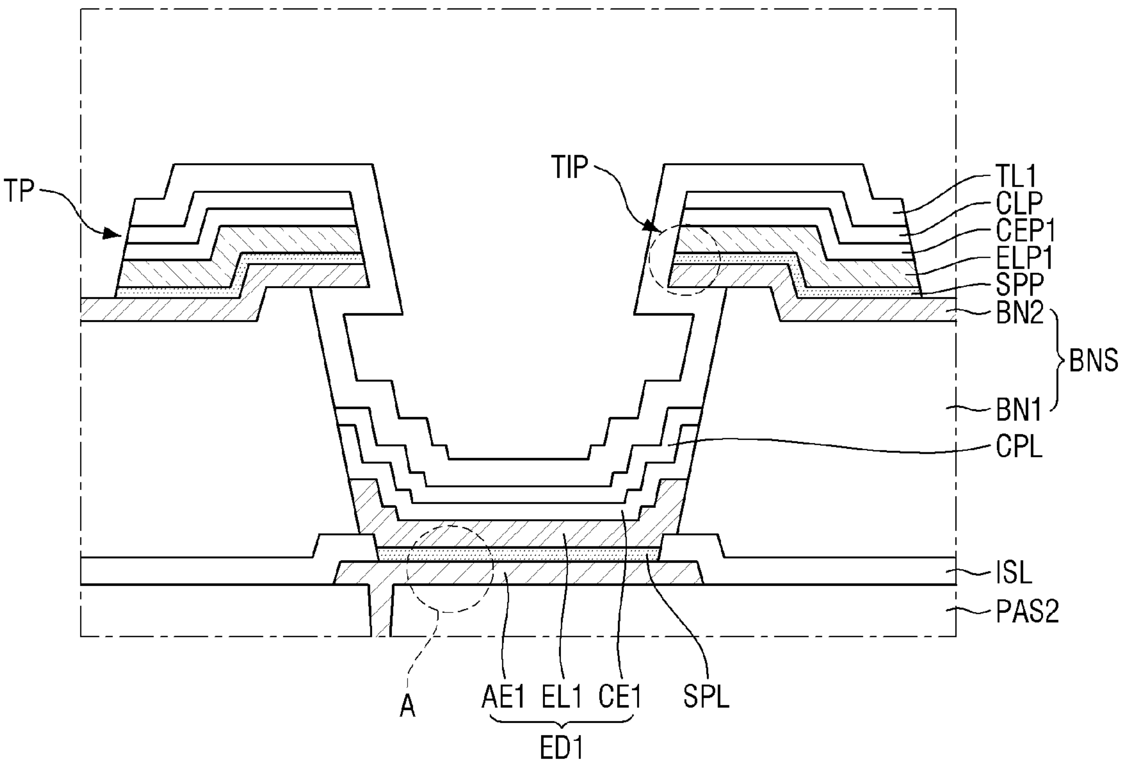
FIG. 7 is a cross-sectional view of a first emission area of FIG. 6.

FIG. 6 is a cross-sectional view of part of the display device of FIG. 1. FIG. 7 is a cross-sectional view of a first emission area of FIG. 6. FIG. 6 illustrates the substrate SUB, the TFT layer TFTL, the light-emitting element layer EML, the thin-film encapsulation layer TFEL, the touch sensing layer TSU, and the color filter layer CFL of the display layer DU. FIG. 7 illustrates parts of a first light-emitting element ED1 disposed in a first emission area EA1 of FIG. 6 and part of a bank structure BNS around the first light-emitting element ED1.

Referring to FIGS. 6 and 7 and further to FIGS. 3 to 5, the display panel 100 of the display device 10 may include the display layer DU. The display layer DU may include the substrate SUB, the TFT layer TFTL, the light-emitting element layer EML, and the thin-film encapsulation layer TFEL. The display panel 100 may include the light-blocking layer BM on the thin-film encapsulation layer TFEL, and the color filters (CF1, CF2, and CF3) of the color filter layer CFL as an antireflection layer RPL. The light-blocking layer BM may be disposed on the thin-film encapsulation layer TFEL, and the color filters (CF1, CF2, and CF3) may be disposed on the light-blocking layer BM. The color filter layer CFL and the light-blocking layer BM may function as antireflection members for the display device 10.

The substrate SUB may be a base substrate or a base member. The substrate SUB may be a flexible substrate that is bendable, foldable, or rollable. In an embodiment, for example, the substrate SUB may include a polymer resin such as PI, but the disclosure is not limited thereto. In an alternative embodiment, for example, the substrate SUB may include a glass or metal material.

The TFT layer TFTL may include a first buffer layer BF1, a lower metal layer BML, a second buffer layer BF2, TFTs "TFT", a gate insulating layer GI, a first interlayer insulating layer ILD1, capacitor electrodes CPE, a second interlayer insulating layer ILD2, first connecting electrodes CNE1, a first passivation layer PAS1, second connecting electrodes CNE2, and a second passivation layer PAS2.

The first buffer layer BF1 may be disposed on the substrate SUB. The first buffer layer BF1 may include an inorganic film capable of preventing the infiltration of the air or moisture. In an embodiment, for example, the first buffer layer BF1 may include a plurality of inorganic films that are alternately stacked one on another.

The lower metal layer BML may be disposed on the first buffer layer BF1. In an embodiment, for example, the lower metal layer BML may be formed as (or defined by) a single layer or a multilayer, each layer therein including molybdenum (Mo), aluminum (Al), chromium (Cr), gold (Au), titanium (Ti), nickel (Ni), neodymium (Nd), copper (Cu), or an alloy thereof, but the disclosure is not limited thereto.

The second buffer layer BF2 may be disposed on the first buffer layer BF1 to cover the first buffer layer BF1 and the lower metal layer BML. The second buffer layer BF2 may include an inorganic film capable of preventing the infiltration of the air or moisture. In an embodiment, for example, the second buffer layer BF2 may include a plurality of inorganic films that are alternately stacked one on another.

The TFTs "TFT" may be disposed on the second buffer layer BF2 and may form or define the pixel circuitry of a plurality of pixels. In an embodiment, for example, the TFTs "TFT" may be driving transistors or switching transistors. The TFTs "TFT" may include semiconductor layers ACT, source electrodes SE, drain electrodes DE, and gate electrodes GE.

The semiconductor layers ACT may be disposed on the second buffer layer BF2. The semiconductor layers ACT may overlap the lower metal layer BML and the gate electrodes GE in the thickness direction and may be insulated from the gate electrodes GE by the gate insulating layer GI. Parts of the semiconductor layers ACT may be transformed into conductors and may thus form the source electrodes SE and the drain electrodes DE.

The gate electrodes GE may be disposed on the gate insulating layer GI. The gate electrodes GE may overlap the semiconductor layers ACT with the gate insulating layer GI interposed therebetween.

The gate insulating layer GI may be disposed on the semiconductor layers ACT. In an embodiment, for example, the gate electrodes GE may cover the semiconductor layers ACT and the second buffer layer BF2 and may insulate the semiconductor layers ACT and the gate electrodes GE from each other. The gate insulating layer GI may be provided with contact holes that are defined or formed therethrough and the first connecting electrodes CNE1 are disposed in the contact holes.

A first interlayer insulating layer ILD1 may be disposed on the gate insulating layer GI to cover the gate electrodes GE and the gate insulating layer GI. The first interlayer insulating layer ILD1 may be provided contact holes defined or formed therethrough and the first connecting electrodes CNE1 are disposed in the contact holes. The contact holes of the first interlayer insulating layer ILD1 may be connected to the contact holes of the gate insulating layer GI and contact holes of a second interlayer insulating layer ILD2.

The capacitor electrodes CPE may be disposed on the first interlayer insulating layer ILD1. The capacitor electrodes CPE may overlap the gate electrodes GE in the thickness direction. The capacitor electrodes CPE and the gate electrodes GE may form (collectively define or constitute) capacitors.

The second interlayer insulating layer ILD2 may cover the capacitor electrodes CPE and the first interlayer insulating layer ILD1. The second interlayer insulating layer ILD2 may be provided with contact holes defined or formed therethrough and the first connecting electrodes CNE1 are disposed in the contact holes. The contact holes of the second interlayer insulating layer ILD2 may be connected to the contact holes of the first interlayer insulating layer ILD1 and the contact holes of the gate insulating layer GI.

The first connecting electrodes CNE1 may be disposed on the second interlayer insulating layer ILD2. The first connecting electrodes CNE1 may electrically connect the drain electrodes DE of the TFTs "TFT" and the second connecting electrodes CNE2. The first connecting electrodes CNE1 may be inserted in the contact holes of each of the second interlayer insulating layer ILD2, the first interlayer insulating layer ILD1, and the gate insulating layer GI and may thus be in contact with the drain electrodes DE of the TFTs "TFT".

The first passivation layer PAS1 may be disposed on the second interlayer insulating layer ILD2 to cover the first connecting electrodes CNE1 and the second interlayer insulating layer ILD2. The first passivation layer PAS1 may protect the TFTs "TFT". The first passivation layer PAS1 may include contact holes that are penetrated by the second connecting electrodes CNE2.

The second connecting electrodes CNE2 may be disposed on the first passivation layer PAS1. The second connecting electrodes CNE2 may electrically connect the first connecting electrodes CNE1 and pixel electrodes (AE1, AE2, and AE3) of light-emitting elements (ED1, ED2, and ED3). The second connecting electrodes CNE2 may be inserted in the contact holes of the first passivation layer PAS1 and may be in contact with the first connecting electrodes CNE1.

The second passivation layer PAS2 may be disposed on the first passivation layer PAS1 to cover the second connecting electrodes CNE2 and the first passivation layer PAS1. The second passivation layer PAS2 may be provided with contact holes defined or formed therethrough, and the pixel electrodes (AE1, AE2, and AE3) of the light-emitting elements (ED1, ED2, and ED3) are disposed in the contact holes.

The light-emitting element layer EML may be disposed on the TFT layer TFTL. The light-emitting element layer EML may include the light-emitting elements (ED1, ED2, and ED3) and the metal structure BNS. The light-emitting elements (ED1, ED2, and ED3) may include the pixel electrodes (AE1, AE2, and AE3), light-emitting layers (EL1, EL2, and EL3), and common electrodes (CE1, CE2, and CE3).

The display device 10 may include a plurality of emission areas (EA1, EA2, and EA3), which are disposed in the display area DA. The emission areas (EA1, EA2, and EA3) may include first, second, and third emission areas EA1, EA2, and EA3, which emit light of different colors from each other. The first, second, and third emission areas EA1, EA2, and EA3 may emit red light, green light, and blue light, respectively, and the colors of beams of light emitted from the emission areas (EA1, EA2, and EA3) may vary depending on the types of the light-emitting elements (ED1, ED2, and ED3) in the light-emitting element layer EML. In an embodiment, for example, the first emission area EA1 may emit first light, which is red light, the second emission area EA2 may emit second light, which is green light, and the third emission area EA3 may emit third light, which is blue light. However, the disclosure is not limited to this example.

The first, second, and third emission areas EA1, EA2, and EA3 may be defined by a plurality of openings (OPE1, OPE2, and OPE3), which are defined or formed in the bank structure BNS of the light-emitting element layer EML. In an embodiment, for example, the first emission area EA1 may be defined by a first opening OPE1 of the bank structure BNS, the second emission area EA2 may be defined by a second opening OPE2 of the bank structure BNS, and the third emission area EA3 may be defined by a third opening OPE3 of the bank structure BNS.

The first, second, and third emission areas EA1, EA2, and EA3 may have a same size (e.g., a same planar area) as each other. In an embodiment, for example, the openings (OPE1, OPE2, and OPE3) of the bank structure BNS may have a same diameter as each other, and the first, second, and third emission areas EA1, EA2, and EA3 may have a same size as each other. However, the disclosure is not limited to this example. Alternatively, the first, second, and third emission areas EA1, EA2, and EA3 may have different sizes from each other. In an embodiment, for example, the second emission area EA2 may be larger in size than the first and third emission areas EA1 and EA3, and the third emission area EA3 may be larger in size than the first emission area EA1. The intensity of light emitted by the emission areas (EA1, EA2, and EA3) may vary depending on the size of the emission areas (EA1, EA2, and EA3), and screen colors displayed by the display device 10 or the electronic device 1 may be controlled by controlling the size of the emission areas (EA1, EA2, and EA3). FIG. 5 illustrates an embodiment where the first, second, and third emission areas EA1, EA2, and EA3 have the same size as each other, but the disclosure is not limited thereto. The size of the emission areas (EA1, EA2, and EA3) may be freely controlled or variously determined in accordance with the screen colors desired for the display device 10 or the electronic device 1. Also, the size of the emission areas (EA1, EA2, and EA3) may be related to the efficiency and lifetime of the light-emitting elements ED and may have a trade-off relation with the reflection of external light. The size of the emission areas (EA1, EA2, and EA3) may be controlled or determined in consideration of all the above.

In an embodiment of the display device 10, one first emission area EA1, one second emission area EA2, and one third emission area EA3, which are disposed adjacent to one another, may form one pixel group. One pixel group may include emission areas (EA1, EA2, and EA3) that emitting light of different colors and may thus be able to display white gradation. However, the disclosure is not limited to this. That is, the combination of emission areas (EA1, EA2, and EA3) forming each pixel group may vary depending on the layout of the emission areas (EA1, EA2, and EA3) and the colors of light emitted from the emission areas (EA1, EA2, and EA3).

The display device 10 may include a plurality of light-emitting elements (ED1, ED2, and ED3), which are disposed in different emission areas (EA1, EA2, and EA3). The light-emitting elements (ED1, ED2, and ED3) may include first, second, and third light-emitting elements ED1, ED2, and ED3, which are disposed in the first, second, and third emission areas ED1, ED2, and ED3, respectively. The light-emitting elements (ED1, ED2, and ED3) may include the pixel electrodes (AE1, AE2, and AE3), the light-emitting layers (EL1, EL2, and EL3), and the common electrodes (CE1, CE2, and CE3) and may emit light of different colors depending on the material of the light-emitting layers (EL1, EL2, and EL3). In an embodiment, for example, the first light-emitting element ED1, which is disposed in the first emission area EA1, may emit the first light, i.e., red light, the second light-emitting element ED2, which is disposed in the second emission area EA2, may emit the second light, i.e., green light, and the third light-emitting element ED3, which is disposed in the third emission area EA3, may emit the third light, i.e., blue light. The first, second, and third emission areas EA1, EA2, and EA3, which form one pixel together, may include the first, second, and third light-emitting elements ED1, ED2, and ED3, respectively, which emit light of different colors, and may thus be able to display white gradation.

The pixel electrodes (AE1, AE2, and AE3) may be disposed on the second passivation layer PAS2. The pixel electrodes (AE1, AE2, and AE3) may be disposed to overlap first, second, and third openings OPE1, OPE2 and OPE3 of a pixel-defining film PDL. The pixel electrodes (AE1, AE2, and AE3) may be electrically connected to the drain electrodes DE of the TFTs "TFT" via the first connecting electrodes CNE1 and the second connecting electrodes CNE2.

The pixel electrodes (AE1, AE2, and AE3) may be disposed in the emission areas (EA1, EA2, and EA3). The pixel electrodes (AE1, AE2, and AE3) may include a first pixel electrode AE1, which is disposed in the first emission area EA1, a second pixel electrode AE2, which is disposed in the second emission area EA2, and a third pixel electrode AE3, which is disposed in the third emission area EA3. The first, second, and third pixel electrodes AE1, AE2, and AE3 may be spaced apart from one another on the second passivation layer PAS2. The pixel electrodes (AE1, AE2, and AE3) may be disposed in different emission areas (EA1, EA2, and EA3), respectively, and may thus form light-emitting elements (ED1, ED2, and ED3) that emit light of different colors.

The pixel electrodes (AE1, AE2, and AE3) may have a structure in which a high work function material layer including indium tin oxide (ITO), indium zinc oxide (IZO), zinc oxide (ZnO) or indium oxide ($In_2O_3$), and a reflective material layer including silver (Ag), magnesium (Mg), Al, platinum (Pt), lead (Pb), palladium (Pd), gold (Au), nickel (Ni), neodymium (Nd), iridium (Ir), Cr, lithium (Li), calcium (Ca) or a mixture thereof are stacked one on another. The high work function material layer may be disposed above the reflective material layer, close to the light-emitting layers (EL1, EL2, and EL3). In an embodiment, for example, the pixel electrodes (AE1, AE2, and AE3) may have a multilayer structure of ITO/Mg, ITO/MgF, ITO/Ag, or ITO/Ag/ITO, but the disclosure is not limited thereto.

An inorganic insulating layer ISL may be disposed on the second passivation layer PAS2 and the pixel electrodes (AE1, AE2, and AE3). The inorganic insulating layer ISL may be disposed on the entire second passivation layer PAS2 and may partially overlap the pixel electrodes (AE1, AE2, and AE3) to expose parts of the top surfaces of the pixel electrodes (AE1, AE2, and AE3). In an embodiment, for example, the inorganic insulating layer ISL may expose the pixel electrodes (AE1, AE2, and AE3) in areas that overlap the openings (OPE1, OPE2, and OPE3) of the bank structure BNS, and the light-emitting layers (EL1, EL2, and EL3) may be disposed directly on the pixel electrodes (AE1, AE2, and AE3). The inorganic insulating layer ISL may include an inorganic insulating material. In an embodiment, for example, the inorganic insulating layer ISL may include aluminum oxide, titanium oxide, tantalum oxide, hafnium oxide, zinc oxide, silicon oxide, silicon nitride, and/or silicon oxynitride.

The inorganic insulating layer ISL may be disposed to cover the edges of each of the pixel electrodes (AE1, AE2, and AE3). The inorganic insulating layer ISL may be in direct contact with parts of the top surfaces of the pixel electrodes (AE1, AE2, and AE3). During the fabrication of the display device 10, the pixel electrodes (AE1, AE2, and AE3) may be exposed by etching parts of the inorganic insulating layer ISL that cover the pixel electrodes (AE1, AE2, and AE3), and in this process, the top surfaces of the pixel electrodes AE1, AE2, and AE3 may be partially damaged, leaving traces. In an embodiment, as the display device 10 includes an auxiliary layer SPL (shown in FIG. 7), which compensates for changes in electrical properties that may be caused by damage to the pixel electrodes (AE1, AE2, and AE3) during the etching of the inorganic insulating layer ISL, the electrical properties of the pixel electrodes AE1, AE2, and AE3 and the light-emitting elements (ED1, ED2, and ED3) can be maintained, without providing a sacrificial layer for preventing damage to the pixel electrodes (AE1, AE2, and AE3). This will be described later in detail.

The display device 10 may include the bank structure BNS, which is disposed on the TFT layer TFTL or the substrate SUB and includes the openings (OPE1, OPE2, and OPE3). The bank structure BNS may have a structure in which a plurality of bank layers including different materials from each other, i.e., first and second bank layers BN1 and BN2, are sequentially stacked one on another, and may be provided with the openings (OPE1, OPE2, and OPE3), which define the emission areas (EA1, EA2, and EA3). The light-emitting elements (ED1, ED2, and ED3) of the display device 10 may be disposed to overlap the openings (OPE1, OPE2, and OPE3) of the bank structure BNS.

The bank structure BNS may include the first bank layer BN1, which is disposed on the inorganic insulating layer ISL, and the second bank layer BN2, which is disposed on the first bank layer BN1.

The first and second bank layers BN1 and BN2 may include different metal materials, and the bank structure BNS may include tips TIP in the second bank layer BN2, which protrude toward the openings (OPE1, OPE2, and OPE3) beyond the first bank layer BN1. Side surfaces of the first bank layer BN1 may be inwardly recessed from side surfaces of the second bank layer BN2. In the bank structure BNS, the first bank layer BN1 may be thicker than the second bank BNK2, and the second bank BN2 may have a relatively small thickness and may define or form the tips TIP during the fabrication of the display device 10. As the second bank layer BN2 protrudes toward a center of the openings (OPE1, OPE2, and OPE3) beyond (or further than) the first bank layer BN1, undercuts may be formed on the inner sidewalls of the openings (OPE1, OPE2, and OPE3), that is, the inner side surfaces of the bank structure BNS defining the openings (OPE1, OPE2, and OPE3), below the tips TIP of the second bank layer BN2.

The bank structure BNS may have the aforementioned sidewall structure because the first and second bank layers BN1 and BN2 include different materials from each other and are thus etched at different rates from each other. The second bank layer BN2 may include a material that is etched slower than the first bank layer BN1, and the first bank layer BN1 may be more etched than the second bank layer BN2 during the formation of the openings (OPE1, OPE2, and OPE3) so that undercuts may be formed below the tips TIP of the second bank layer BN2. The first bank layer BN1 may include a metal material with high electric conductivity, and the second bank layer BN2 may include a metal material with low reflectance. In an embodiment, for example, the first bank layer BN1 may include Al, and the second bank layer BN2 may include Ti. The bank structure BNS may have a structure in which Al and Ti layers are stacked on the inorganic insulating layer ISL, and the tips TIP may be formed in the Ti layer, i.e., in the second bank layer BN2.

The bank structure BNS may be provided with the openings (OPE1, OPE2, and OPE3), which define the emission areas (EA1, EA2, and EA3), and the light-blocking layer BM may be disposed on the bank structure BNS. The uppermost layer of the bank structure BNS may include a material with low reflectance and may thus be able to reduce the reflection of external light. Also, the first bank layer BN1 of the bank structure BNS may include conductive material and be electrically connected to the common electrodes (CE1, CE2, and CE3) of the light-emitting elements (ED1, ED2, and ED3). The light-emitting elements (ED1, ED2, and ED3), which are disposed in the emission areas (EA1, EA2, and EA3), may not be directly connected to the common electrodes (CE1, CE2, and CE3), but may be electrically connected to the common electrodes (CE1, CE2, and CE3) through the first bank layer BN1 of the bank structure BNS.

During the fabrication of the display device 10, mask processes may be used to form a pixel-defining film, which forms the emission areas (EA1, EA2, and EA3), of an organic material and to form the light-emitting layers (EL1, EL2, and EL3) in the emission areas (EA1, EA2, and EA3). In order to perform the mask processes, the display device 10 may be desired to have a structure for mounting masks or a large-size non-display area NDA to control dispersion in accordance with the mask processes. If the mask processes are minimized, undesired components such as, for example, the structure for mounting masks, may not be provided in the display device 10, and the size of the non-display area NDA for the control of dispersion control can be minimized.

In an embodiment, the display device 10 may include the bank structure BNS, which define the light emitting areas EA1, EA2, and EA3, and the bank structure BNS may be formed by deposition and etching processes without using a mask. In such an embodiment, as the bank structure BNS includes the first and second bank layers BN1 and BN2, which include different metal materials from each other and the inner sidewalls of the openings (OPE1, OPE2, and OPE3) include tips TIP, different layers can be formed separately in different emission areas (EA1, EA2, and EA3), simply through deposition. In an embodiment, for example, even if the light-emitting layers (EL1, EL2, and EL3) and the common electrodes (CE1, CE2, and CE3) of the light-emitting elements (ED1, ED2, and ED3) are formed by deposition processes not using masks, deposited materials for forming the light-emitting layers (EL1, EL2, and EL3) and the common electrodes (CE1, CE2, and CE3) of the light-emitting elements (ED1, ED2, and ED3) may not be connected, but disconnected between the openings (OPE1, OPE2, and OPE3) by the tips TIP of the second bank layer BN2, which are formed on the inner sidewalls of the openings (OPE1, OPE2, and OPE3). After the formation of a particular layer through deposition on the entire surface of the display device 10, the particular layer may be etched away from undesignated areas. In this manner, different layers can be formed in different emission areas (EA1, EA2, and EA3). Different light emitting devices (ED1, ED2, and ED3) can be formed in different emission areas (EA1, EA2, and EA3) through deposition and etching, without using a mask process, undesired components can be omitted from the display device, and the size of the non-display area NDA can be minimized.

The display device 10 may include an auxiliary layer SPL, which is disposed on the pixel electrodes (AE1, AE2, and AE3) of the light-emitting elements (ED1, ED2, and ED3). The auxiliary layer SPL may be disposed to cover parts of the top surfaces of the pixel electrodes (AE1, AE2, and AE3) that are exposed through etched parts of the inorganic insulating layer ISL. In an embodiment, for example, the auxiliary layer SPL may be disposed directly on, and in direct contact with, the top surfaces of the pixel electrodes (AE1, AE2, and AE3). In an embodiment, the auxiliary layer SPL may be disposed on parts of the pixel electrodes (AE1, AE2, and AE3) where the inorganic insulating layer ISL is not disposed, but the disclosure is not limited thereto. In some embodiments, the auxiliary layer SPL may be larger in size than the exposed parts of the top surfaces of the pixel electrodes (AE1, AE2, and AE3) and may be disposed in part on the inorganic insulating layer ISL.

Figure 8:
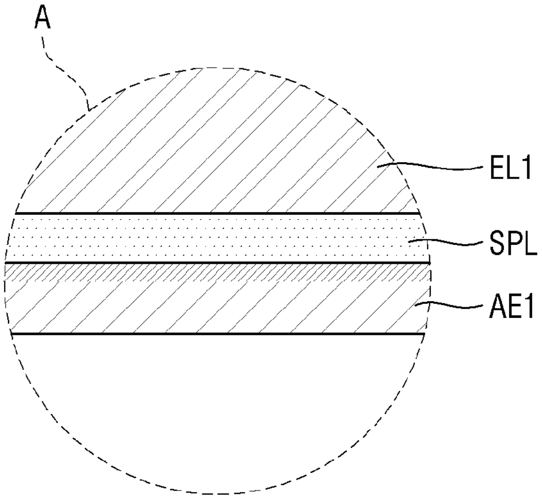
FIG. 8 is an enlarged cross-sectional view of an area A of FIG. 7.

FIG. 8 is an enlarged cross-sectional view of an area A of FIG. 7.

Referring to FIG. 8, there may be damaged regions on parts of the top surfaces of the pixel electrodes (AE1, AE2, and AE3). As will be described later, during the fabrication of the display device 10, an etching process may be performed to expose the top surfaces of the pixel electrodes (AE1, AE2, and AE3). In an embodiment, a sacrificial layer for preventing damage to the pixel electrodes (AE1, AE2, and AE3) during the etching process is not provided, such that parts of the top surfaces of the pixel electrodes (AE1, AE2, and AE3) may be damaged, as illustrated in FIG. 8. The damaged parts of the top surfaces of the pixel electrodes (AE1, AE2, and AE3) may cause a shift in a driving voltage in a voltage-current graph and may even result in changes in the emission characteristics of the light-emitting elements (ED1, ED2, and ED3).

In an embodiment, the auxiliary layer SPL may be disposed directly on the pixel electrodes (AE1, AE2, and AE3) and may prevent changes in the electrical properties of the pixel electrodes (AE1, AE2, and AE3) that may be caused by damage to the pixel electrodes (AE1, AE2, and AE3) during the fabrication of the display device 10. In an embodiment, the auxiliary layer SPL, like the pixel electrodes (AE1, AE2, and AE3), may include a material having a high hole injection capability to prevent a shift in a driving voltage that may be caused by damaged pixel electrodes (AE1, AE2, and AE3). In such an embodiment, the auxiliary layer SPL may include a material having a low electrical conductivity to prevent the pixel electrodes (AE1, AE2, and AE3) from being short-circuited via the auxiliary layer SPL. The auxiliary layer SPL may be placed in contact with the first bank layer BN1 of the bank structure BNS, depending on the conditions of a deposition process for forming the auxiliary layer SPL. In an embodiment, as the auxiliary layer SPL has a low electrical conductivity, the pixel electrodes (AE1, AE2, and AE3) can be effectively prevented from being short-circuited via the auxiliary layer SPL and the first bank layer BN1.

The auxiliary layer SPL may include tungsten oxide ($WO_x$). $WO_x$ has a work function of 5.2 electronvolts (eV) or greater and has a high hole injection capability like the material of the pixel electrodes (AE1, AE2, and AE3). However, as $WO_x$ has a relatively low electrical conductivity, the pixel electrodes (AE1, AE2, and AE3) can be effectively prevented from being short-circuited via the auxiliary layer SPL. The auxiliary layer SPL may not include ITO, which has a high work function and a high electrical conductivity like the material of the pixel electrodes (AE1, AE2, and AE3). The auxiliary layer SPL, which is disposed directly on the pixel electrodes (AE1, AE2, and AE3), can effectively prevent a shift in a driving voltage in a voltage-current graph that may be caused by damaged pixel electrodes (AE1, AE2, and AE3).

Figure 9:
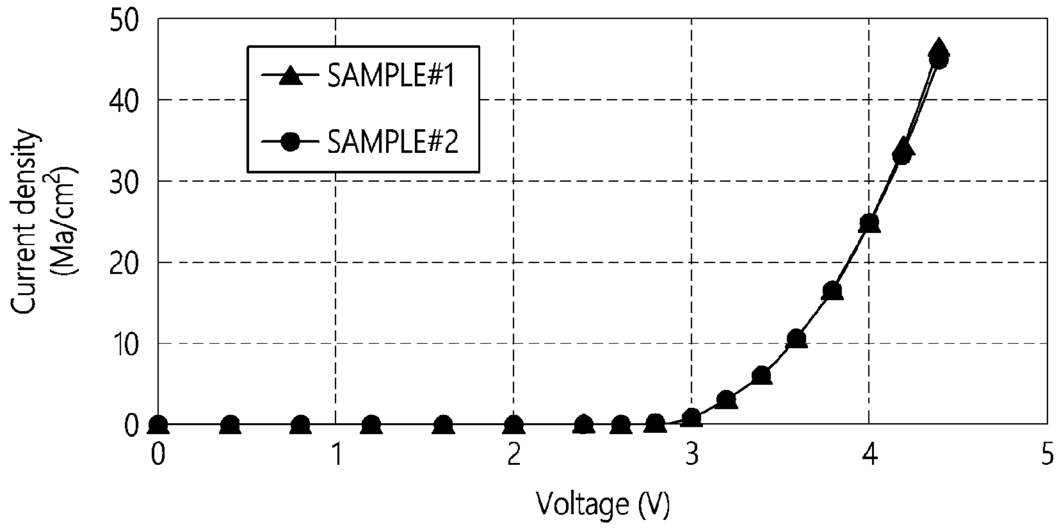
FIG. 9 is a voltage-current graph for cases where an auxiliary layer is present and absent in each pixel electrode of the display device of FIG. 2.

FIG. 9 is a voltage-current graph for cases where an auxiliary layer is present and absent in each pixel electrode of the display device of FIG. 2. In FIG. 9, "SAMPLE #1" refers to pixel electrodes (AE1, AE2, and AE3) having a stack of ITO/Ag/ITO, and "SAMPLE #2" refers to pixel electrodes (AE1, AE2, and AE3) having an auxiliary layer SPL formed of $WO_x$ and having a stack of ITO/Ag/IGZO/$WO_x$.

Referring to FIG. 9, the voltage-current curve of SAMPLE #1 almost coincides with the voltage-current curve of SAMPLE #2. SAMPLE #1 has a driving voltage of about 3 volts (V), and SAMPLE #2 also has a driving voltage of about 3 V. This means that even if the uppermost ITO layers of the pixel electrodes (AE1, AE2, and AE3) are partially damaged or deformed to form IGZO, the slope of the voltage-current curve of the pixel electrodes (AE1, AE2, and AE3) or the driving voltage of the pixel electrodes (AE1, AE2, and AE3) does not substantially change due to the presence of the auxiliary layer SPL including $WO_x$. The auxiliary layer SPL of the display device 10 can effectively prevent changes in the electrical properties of the pixel electrodes (AE1, AE2, and AE3) that may be caused by damage to the pixel electrodes (AE1, AE2, and AE3).

During the fabrication of the display device 10, additional processes may be further performed after the placement of the auxiliary layer SPL. If the auxiliary layer SPL is removed or dissolved in such processes, the damaged parts of the top surfaces of the pixel electrodes (AE1, AE2, and AE3) may be exposed.

In an embodiment, the auxiliary layer SPL may further include tantalum oxide ($TaO_x$) having high resistance to water or a developing solution to prevent the auxiliary layer SPL from being removed or dissolved in a subsequent process. As $TaO_x$ is resistant to water or a developing solution such as tetramethylammonium hydroxide (TMAH), the auxiliary layer SPL including $WO_x$ can be effectively prevented from being dissolved and removed by a developing solution. The auxiliary layer SPL may include a certain amount of $TaO_x$, but not to the extent that the work function and the electrical conductivity of the auxiliary layer SPL change significantly. In an embodiment, the auxiliary layer SPL may include $WO_x$ and $TaO_x$, and the $TaO_x$ content of the auxiliary layer SPL may be in a range of about 5 weigh percent (wt %) to about 12 wt %.

Accordingly, in such an embodiment, the auxiliary layer SPL may not be removed in subsequent processes, but may remain on the pixel electrodes (AE1, AE2, and AE3). The auxiliary layer SPL may have a thickness of about 150 angstrom (A) or greater and may inject holes into the light-emitting layers (EL1, EL2, and EL3), on the pixel electrodes (AE1, AE2, and AE3).

Referring back to FIGS. 6 and 7, the light-emitting layers (EL1, EL2, and EL3) may be disposed on the auxiliary layer SPL. The light-emitting layers (EL1, EL2, and EL3) may be organic light-emitting layers formed of an organic material and may be formed on the auxiliary layer SPL through deposition. The light-emitting layers (EL1, EL2, and EL3) may apply a predetermined voltage to the pixel electrodes (AE1, AE2, and AE3) of the light-emitting elements (ED1, ED2, and ED3), and when common electrodes (CE1, CE2, and CE3) of the light-emitting elements (ED1, ED2, and ED3) receive a common voltage or a cathode voltage, holes and electrons may move to the light-emitting elements (ED1, ED2, and ED3) through a hole transport layer and an electron transport layer and may combine together in the light-emitting layers (EL1, EL2, and EL3) to emit light.

The light-emitting layers (EL1, EL2, and EL3) may include first, second, and third light-emitting layers EL1, EL2, and EL3, which are disposed in different emission areas (EA1, EA2, and EA3), respectively. The first light-emitting layer EL1 may be disposed on the first pixel electrode AE1 and the auxiliary layer SPL, in the first emission area EA1, the second light-emitting layer EL2 may be disposed on the second pixel electrode AE1 and the auxiliary layer SPL, in the second emission area EA2, and the third light-emitting layer EL3 may be disposed on the third pixel electrode AE3 and the auxiliary layer SPL, in the third emission area EA3. The first, second, and third light-emitting layers EL1, EL2, and EL3 may be the light-emitting layers of the first, second, and third light-emitting elements ED1, ED2, and ED3. The first light-emitting layer EL1 may be a light-emitting layer emitting the first light, i.e., red light, the second light-emitting layer EL2 may be a light-emitting layer emitting the second light, i.e., green light, and the third light-emitting layer EL3 may be a light-emitting layer emitting the third light, i.e., blue light.

The light-emitting layers (EL1, EL2, and EL3) of the light-emitting elements (ED1, ED2, and ED3) may be disposed directly on the auxiliary layer SPL. Holes from the pixel electrodes (AE1, AE2, and AE3) may be transmitted to the light-emitting layers (EL1, EL2, and EL3) through the auxiliary layer SPL, and electrons from the common electrodes (CE1, CE2, and CE3) may combine with the holes, thereby emitting light. The auxiliary layer SPL can properly deliver the holes from the pixel electrodes (AE1, AE2, and AE3) to the light-emitting layers (EL1, EL2, and EL3) and may not cause changes in the electrical/optical properties of the light-emitting elements (ED1, ED2, and ED3) even if the pixel electrodes (AE1, AE2, and AE3) are damaged during the fabrication of the display device 10. As the display device 10 includes the auxiliary layer SPL, a sacrificial layer for preventing damage to the pixel electrodes (AE1, AE2, and AE3) can be omitted. As a result, as the inorganic insulating layer ISL is disposed directly on the pixel electrodes (AE1, AE2, and AE3), the light-emitting layers (EL1, EL2, and EL3) can be effectively prevented from being disconnected by tips in the inorganic insulating layer ISL.

The common electrodes (CE1, CE2, and CE3) may be disposed on the light-emitting layers (EL1, EL2, and EL3). The common electrodes (CE1, CE2, and CE3) may include a transparent conductive material and thus output light generated by the light-emitting layers (EL1, EL2, and EL3). The common electrodes (CE1, CE2, and CE3) may receive a common voltage or a low-potential voltage. As the pixel electrodes (AE1, AE2, and AE3) receive a voltage corresponding to a data voltage and the common electrodes (CE1, CE2, and CE3) receive a low-potential voltage, the difference in electric potential is formed between the pixel electrodes (AE1, AE2, and AE3) and the common electrodes (CE1, CE2, and CE3), and as a result, the light-emitting layers (EL1, EL2, and EL3) may emit light.

The common electrodes (CE1, CE2, and CE3) may include low work function material layers including Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg). The common electrodes (CE1, CE2, and CE3) may further include transparent metal oxide layers, which are disposed on the low work function material layers.

The common electrodes (CE1, CE2, and CE3) may include first, second, and third common electrodes CE1, CE2, and CE3, which are disposed in different emission areas (EA1, EA2, and EA3), respectively. The first common electrode CE1 may be disposed on the first light-emitting layer EL1, in the first emission area EA1, the second common electrode CE2 may be disposed on the second light-emitting layer EL2, in the second emission area EA2, and the third common electrode CE3 may be disposed on the third light-emitting layer EL3, in the third emission area EA3.

Parts of the common electrodes (CE1, CE2, and CE3) of the light-emitting elements (ED1, ED2, and ED3) may be disposed on the side surfaces of the first bank layer BN1 of the bank structure BNS. The common electrodes (CE1, CE2, and CE3), like the light-emitting layers (EL1, EL2, and EL3), may be formed by deposition. The deposition of the common electrodes (CE1, CE2, and CE3) may be performed such that an electrode material for forming the common electrodes (CE1, CE2, and CE3) may be deposited diagonally, rather than perpendicularly, with respect to the top surface of the substrate SUB. Accordingly, the common electrodes (CE1, CE2, and CE3) may be disposed on the side surfaces of the first bank layer BN1, below the tips TIP of the second bank layer BN2 of the bank structure BNS. The common electrodes (CE1, CE2, and CE3) may be in direct contact with the side surfaces of the first bank layer BN1. The common electrodes (CE1, CE2, and CE3) of different light-emitting elements (ED1, ED2, and ED3) may be in direct contact with the first bank layer BN1 of the bank structure BNS and may be electrically connected to one another. The common electrodes (CE1, CE2, and CE3), unlike the pixel electrodes (AE1, AE2, and AE3), may not be separate (or insulated) between multiple pixels, but may be in common electrically for all pixels.

The contact areas of the common electrodes (CE1, CE2, and CE3) and the side surfaces of the first bank layer BN1 may be greater than the contact areas of the light-emitting layers (EL1, EL2, and EL3) and the side surfaces of the first bank layer BN1. The material of the common electrodes (CE1, CE2, and CE3) and the material of the light-emitting layers (EL1, EL2, and EL3) may be deposited diagonally, rather than perpendicularly, with respect to the top surface of the substrate SUB, and the contact areas of the common electrodes (CE1, CE2, and CE3) and the side surfaces of the first bank layer BN1 and the contact areas of the light-emitting layers (EL1, EL2, and EL3) and the side surfaces of the first bank layer BN1 may vary depending on the inclinations at which the material of the common electrodes (CE1, CE2, and CE3) and the material of the light-emitting layers (EL1, EL2, and EL3) are deposited. The material of the common electrodes (CE1, CE2, and CE3) may be deposited at a greater inclination than the material of the light-emitting layers (EL1, EL2, and EL3). The common electrodes (CE1, CE2, and CE3) may be deposited over larger areas of the sidewalls of the openings (OPE1, OPE2, and OPE3) and to greater heights in the openings (OPE1, OPE2, and OPE3) than the light-emitting layers (EL1, EL2, and EL3). In an embodiment, the common electrodes (CE1, CE2, and CE3) may be in contact with a relatively large area of the first bank layer BN1 such that the common electrodes (CE1, CE2, and CE3) of different light-emitting elements (ED1, ED2, and ED3) are effectively electrically connected to each other via the first bank layer BN1.

A capping layer CPL may be disposed on the common electrodes (CE1, CE2, and CE3). The capping layer CPL may include an inorganic insulating material and may cover the light-emitting elements (ED1, ED2, and ED3) and patterns on the bank structure BNS. The capping layer CPL may effectively prevent the light-emitting elements (ED1, ED2, and ED3) from being damaged by external air, and may effectively prevent the patterns on the bank structure BNS from being peeled off during the fabrication of the display device 10. The capping layer CPL may include aluminum oxide, titanium oxide, tantalum oxide, hafnium oxide, zinc oxide, silicon oxide, silicon nitride, and/or silicon oxynitride.

During the fabrication of the display device 10, the auxiliary layer SPL, the light-emitting layers (EL1, EL2, and EL3) and the common electrodes (CE1, CE2, and CE3) of the light-emitting elements (ED1, ED2, and ED3), and the capping layer CPL may be formed by deposition processes. As the bank structure BNS includes the tips TIP, which are formed in the second bank layer BN2, layers that are separate (or disconnected) between different openings (OPE1, OPE2, and OPE3) can be formed by performing deposition on the entire surface of the display area DA of the display panel 100 without using a mask. First, second, and third inorganic layers TL1, TL2, and TL3, which are formed after the formation of the common electrodes (CE1, CE2, and CE3), may be disposed to cover the periphery of the emission areas (EA1, EA2, and EA3), on the bank structure BNS, and patterns including same materials as the auxiliary layer SPL, the light-emitting layers (EL1, EL2, and EL3), the common electrodes (CE1, CE2, and CE3), and the capping layer CPL, respectively, may remain on the bank structure BNS.

The display device 10 may include an auxiliary layer pattern SPP, first, second, and third organic patterns ELP1, ELP2, and ELP3, first, second, and third electrode patterns CEP1, CEP2, and CEP3, and a capping pattern CLP.

The auxiliary layer pattern SPP may include a same material as the auxiliary layer SPL and may be disposed on the bank structure BNS. The auxiliary layer pattern SPP may be disposed on the second bank layer BN2 to surround each of the openings (OPE1, OPE2, and OPE3) of the bank structure BNS, in a plan view.

A plurality of organic patterns (ELP1, ELP2, and ELP3) may be disposed on the auxiliary layer pattern SPP. The organic patterns (ELP1, ELP2, and ELP3) may include the first, second, and third organic patterns ELP1, ELP2, and ELP3, which include same materials as the light-emitting layers (EL1, EL2, and EL3) of the light-emitting elements (ED1, ED2, and ED3), respectively.

The first organic pattern ELP1 may include a same material as the first light-emitting layer EL1 of the first light-emitting element ED1. The second organic pattern ELP2 may include a same material as the second light-emitting layer EL2 of the second light-emitting element ED2. The third organic pattern ELP3 may include a same material as the third light-emitting layer EL3 of the third light-emitting element ED3. The organic patterns (ELP1, ELP2, and ELP3) may be formed by a same processes as the light-emitting layer (EL1, EL2, and EL3). The organic patterns (ELP1, ELP2, and ELP3) may be disposed near the emission areas (EA1, EA2, and EA3), in which the light-emitting layers (EL1, EL2, and EL3) are disposed. In an embodiment, for example, the first organic pattern ELP1 may surround the first opening OPE1, near the first emission area EA1 or the first opening OPE1, and may be disposed on the auxiliary layer pattern SPP. In an embodiment, for example, the second organic pattern ELP2 may surround the second opening OPE2, near the second emission area EA2 or the second opening OPE2, and may be disposed on the auxiliary layer pattern SPP. In an embodiment, for example, the third organic pattern ELP3 may surround the third opening OPE3, near the third emission area EA3 or the third opening OPE3, and may be disposed on the auxiliary layer pattern SPP.

As the bank structure BNS includes the tips TIP, the organic patterns (ELP1, ELP2, and ELP3) may be traces of the deposited material for forming the light-emitting layers (EL1, EL2, and EL3) that are disconnected from the light-emitting layers (EL1, EL2, and EL3) by the tips TIP of the bank structure BNS. The light-emitting layers (EL1, EL2, and EL3) may be formed in the openings (OPE1, OPE2, and OPE3) and may be disconnected from the organic patterns (ELP1, ELP2, and ELP3) by the tips TIP of the bank structure BNS. As the light-emitting layers (EL1, EL2, and EL3) are formed by deposition without using a mask, the material of the light-emitting layers (EL1, EL2, and EL3) may be initially deposited on the entire bank structure BNS and may then be patterned around the emission areas (EA1, EA2, and EA3) or the openings (OPE1, OPE2, and OPE3), thereby obtaining the organic patterns (ELP1, ELP2, and ELP3).

A plurality of electrode patterns (CEP1, CEP2, and CEP3) may be disposed on the organic patterns (ELP1, ELP2, and ELP3). The electrode patterns (CEP1, CEP2, and CEP3) may include the first, second, and third electrode patterns CEP1, CEP2, and CEP3, which include the same material as the common electrodes (CE1, CE2, and CE3) of the light-emitting elements (ED1, ED2, and ED3).

In an embodiment, for example, the first, second, and third electrode patterns CEP1, CEP2, and CEP3 may be disposed directly on the first, second, and third organic patterns ELP1, ELP2, and ELP3, respectively. The relationship between the electrode patterns (CEP1, CEP2, and CEP3) and the organic patterns (ELP1, ELP2, and ELP3) may be the same as the relationship between the common electrodes (CE1, CE2, and CE3) and the light-emitting layers (EL1, EL2, and EL3) of the light-emitting elements (ED1, ED2, and ED3). The electrode patterns (CEP1, CEP2, and CEP3) may be traces of the deposited material for forming the common electrodes (CE1, CE2, and CE3) that are disconnected from the common electrodes (CE1, CE2, and CE3) by the tips TIP of the bank structure BNS. Due to the presence of the tips TIP of the bank structure BNS, the common electrodes (CE1, CE2, and CE3) can be formed separately in different areas even by a deposition process not using a mask.

The capping pattern CLP may be disposed on the electrode patterns (CEP1, CEP2, and CEP3). The capping pattern CLP may include a same material as the capping layer CPL on the common electrodes (CE1, CE2, and CE3). The capping pattern CLP may be disposed directly on the first, second, and third electrode patterns CEP1, CEP2, and CEP3. The relationship between the capping pattern CLP and the electrode patterns (CEP1, CEP2, and CEP3) may be the same as the relationship between the capping layer CPL and the common electrodes (CE1, CE2, and CE3) of the light-emitting elements (ED1, ED2, and ED3). The capping pattern CLP may be a trace of the deposited material for forming the capping layer CPL that is disconnected from the capping layer CPL by the tips TIP of the bank structure BNS.

The auxiliary layer pattern SPP, the organic patterns (ELP1, ELP2, and ELP3), the electrode patterns (CEP1, CEP2, and CEP3), and the capping pattern CLP may be disposed on the bank structure BNS to surround the emission areas (EA1, EA2, and EA3) or the openings (OPE1, OPE2, and OPE3). During the fabrication of the display device 10, stacks of the auxiliary layer patterns SSP, the organic patterns (ELP1, ELP2, and ELP3), the electrode patterns (CEP1, CEP2, and CEP3), and the capping pattern CLP may be partially etched around the emission areas (EA1, EA2, and EA3), and as a result, the shape of the stacks of the auxiliary layer patterns SSP, the organic patterns (ELP1, ELP2, and ELP3), the electrode patterns (CEP1, CEP2, and CEP3), and the capping pattern CLP may change. Accordingly, parts of the top surface of the second bank layer BN2 of the bank structure BNS may not be covered by the auxiliary layer patterns SSP, the organic patterns (ELP1, ELP2, and ELP3), the electrode patterns (CEP1, CEP2, and CEP3), and the capping pattern CLP, and trenches TP may be formed on the corresponding parts of the top surface of the second bank layer BN2 of the bank structure BNS.

The thin-film encapsulation layer TFEL may be disposed on the light-emitting elements (ED1, ED2, and ED3) and the bank structure BNS and may cover the light-emitting elements (ED1, ED2, and ED3) and the bank structure BNS. The thin-film encapsulation layer TFEL may include at least one inorganic film and may effectively prevent the infiltration of oxygen or moisture into the light-emitting element layer EML. The thin film-encapsulation layer TFEL may also include at least one organic film and may protect the light-emitting element layer EML from a foreign material such as dust.

The thin film-encapsulation layer TFEL may include first, second, and third encapsulation layers TFE1, TFE2, and TFE3, which are sequentially stacked one on another. The first and third encapsulation layers TFE1 and TFE3 may be inorganic encapsulation layers, and the second encapsulation layer TFE2, which is disposed between the first and third encapsulation layers TFE1 and TFE3, may be an organic encapsulation layer.

The first and third encapsulation layers TFE1 and TFE3 may include an inorganic insulating material. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer material. The polymer material may include an acrylic resin, an epoxy resin, polyimide, or polyethylene. The second encapsulation layer TFE2 may include an acrylic resin, for example, polymethyl methacrylate or polyacrylic acid. The second encapsulation layer TFE2 may be formed by curing a monomer or applying a polymer.

The first encapsulation layer TFE1 may be disposed on the light-emitting elements (ED1, ED2, and ED3), on the patterns on the bank structure BNS, and on the bank structure BNS. The first encapsulation layer TFE1 may include the first, second, and third inorganic layers TL1, TL2, and TL3, which are disposed to correspond to different emission areas (EA1, EA2, and EA3), respectively.

The first, second, and third inorganic layers TL1, TL2, and TL3 may include an inorganic insulating material and may cover the light-emitting elements (ED1, ED2, and ED3). The first, second, and third inorganic layers TL1, TL2, and TL3 may effectively prevent the light-emitting elements (ED1, ED2, and ED3) from being damaged by external air and may prevent the patterns on the bank structure BNS from being peeled off during the fabrication of the display device 10. The first, second, and third inorganic layers TL1, TL2, and TL3 may include aluminum oxide, titanium oxide, tantalum oxide, hafnium oxide, zinc oxide, silicon oxide, silicon nitride, and/or silicon oxynitride.

The first, second, and third inorganic layers TL1, TL2, and TL3 may be formed on the bank structure BNS and may be disposed to cover the light-emitting elements (ED1, ED2, and ED3), in the emission areas (EA1, EA2, and EA3) or the openings (OPE1, OPE2, and OPE3) of the bank structure BNS. The first, second, and third inorganic layers TL1, TL2, and TL3 may be disposed directly on the capping layer CPL, in the openings (OPE1, OPE2, and OPE3) of the bank structure BNS. The first, second, and third inorganic layers TL1, TL2, and TL3 may be formed by chemical vapor deposition (CVD) to have a uniform thickness along the underlying step differences. In an embodiment, for example, the first, second, and third inorganic layers TL1, TL2, and TL3 may form thin films below the undercuts formed by the tips TIP of the bank structure BNS.

In an embodiment, as shown in FIG. 6, the first, second, and third inorganic layers TL1, TL2, and TL3 may be disposed directly on a same layer, but may be formed by different processes of the fabrication of the display device 10. In an embodiment, for example, the light-emitting layers (EL1, EL2, and EL3) of the light-emitting elements (ED1, ED2, and ED3) may be formed not at the same time, but by different processes. Similarly, the first, second, and third inorganic layers TL1, TL2, and TL3 may be formed by different processes, respectively. The first inorganic layer TL1 may be formed after the formation of the first common electrode CE1, the second inorganic layer TL2 may be formed after the second common electrode CE2, and the third inorganic layer TL3 may be formed after the formation of the third common electrode CE3. In such an embodiment, the first inorganic layer TL1 may be formed earlier than the second and third light-emitting elements ED2 and ED3, and the second inorganic layer TL2 may be formed earlier than the third light-emitting element ED3.

The first, second, and third inorganic layers TL1, TL2, and TL3 may be disposed in part on the bank structure BNS, around the emission areas (EA1, EA2, and EA3). The inorganic layers TL1, TL2, and TL3 may be initially formed to completely cover the bank structure BNS and may then be partially patterned later.

The first inorganic layer TL1 may be disposed on the first light-emitting element ED1. The first inorganic layer TL1 may be disposed to cover the first light-emitting element ED1 and the inner sidewall of the first opening ° PEI. The first inorganic layer TL1 may also be disposed on the bank structure BNS to cover the auxiliary layer pattern SPP, the first organic pattern ELP1, the first electrode pattern CEP1, and the capping pattern CLP, around the first opening OPE1.

The second inorganic layer TL2 may be disposed on the second light-emitting element ED2. The second inorganic layer TL2 may be disposed to cover the second light-emitting element ED2 and the inner sidewall of the second opening OPE2. The second inorganic layer TL2 may also be disposed on the bank structure BNS to cover the auxiliary layer pattern SPP, the first organic pattern ELP1, the first electrode pattern CEP1, and the capping pattern CLP, around the second opening OPE2.

The third inorganic layer TL3 may be disposed on the third light-emitting element ED3. The third inorganic layer TL3 may be disposed to cover the third light-emitting element ED3 and the inner sidewall of the third opening OPE3. The third inorganic layer TL3 may also be disposed on the bank structure BNS to cover the auxiliary layer pattern SPP, the first organic pattern ELP1, the first electrode pattern CEP1, and the capping pattern CLP, around the third opening OPE3.

In a plan view, the first, second, and third inorganic layers TL1, TL2, and TL3 may be disposed on the bank structure BNS to be spaced apart from one another. Accordingly, parts of the second bank layer BN2 of the bank structure BNS that do not overlap the first, second, and third inorganic layers TL1, TL2, and TL3 may be exposed and may be in direct contact with the second encapsulation layer TFE2 of the thin-film encapsulation layer TFEL.

The touch sensing layer TSU may be disposed on the thin-film encapsulation layer TFEL. The touch sensing layer TSU may include a first touch insulating layer SILL a second touch insulating layer SIL2, touch electrodes TEL, and a third touch insulating layer SIL3.

The first touch insulating layer SIL1 may be disposed on the thin-film encapsulation layer TFEL. The first touch insulating layer SIL1 may have insulating and optical functions. The first touch insulating layer SIL1 may include at least one inorganic layer. The first touch insulating layer SIL1 may be optional or selectively omitted.

The second touch insulating layer SIL2 may cover the first touch insulating layer SIL1. Although not specifically illustrated, other touch electrodes TEL may be disposed on the first touch insulating layer SIL1 and may be covered by the second touch insulating layer SIL2. The second touch insulating layer SIL2 may have insulating and optical functions. In an embodiment, for example, the second touch insulating layer SIL2 may be an inorganic film including at least one selected from a silicon nitride layer, a silicon oxy nitride layer, a silicon oxide layer, a titanium oxide layer, and an aluminum oxide layer.

Some of the touch electrodes TEL may be disposed on the second touch insulating layer SIL2. The touch electrodes TEL may not overlap the first, second, and third emission areas EA1, EA2, and EA3. The touch electrodes TEL may be formed as (or defined by) single layers including Mo, Ti, Cu, Al, ITO or an Ag—Pd—Cu (APC) alloy, or as stacks (or a multi layer) of Al and Ti (e.g., Ti/Al/Ti), Al and ITO (e.g., ITO/Al/ITO), or an APC alloy and ITO (e.g., ITO/APC/ITO).

The third touch insulating layer SIL3 may cover the touch electrodes TEL and the second touch insulating layer SIL2. The third touch insulating layer SIL3 may have insulating and optical functions. The third touch insulating layer SIL3 may include or be formed of at least one selected from the aforementioned materials of the second touch insulating layer SIL2.

The antireflection layer RPL may be disposed on the touch sensing layer TSU. The antireflection layer RPL may include the light-blocking layer BM and the color filter layer CFL.

The light-blocking layer BM may be disposed on the touch sensing layer TSU. The light-blocking layer BM may be provided the opening holes (OPT1, OPT2, and OPT3), which are defined therethrough to overlap the emission areas (EA1, EA2, and EA3), respectively. In an embodiment, for example, a first opening hole OPT1 may be disposed to overlap the first emission area EA1, a second opening hole OPT2 may be disposed to overlap the second emission area EA2, and a third opening hole OPT3 may be disposed to overlap the third emission area EA3. The opening holes (OPT1, OPT2, and OPT3) may have a larger area or size than the emission areas (EA1, EA2, and EA3), which are defined by the bank structure BNS. As the opening holes (OPT1, OPT2, and OPT3) of the light-blocking layer BM are formed to be larger in size than the emission areas (EA1, EA2, and EA3), light emitted from the emission areas (EA1, EA2, and EA3) can be visible to the user not only at the front, but also at the sides of the display device 10.

The light-blocking layer BM may include a light-absorbing material. In an embodiment, for example, the light-blocking layer BM may include an inorganic black pigment or an organic black pigment. The inorganic black pigment may be, but is not limited to, carbon black, and the organic black pigment may include, but is not limited to, at least one of lactam black, perylene black, and aniline black. The light-blocking layer BM can effectively prevent visible light from infiltrating between the first, second, and third emission areas EA1, EA2, and EA3 to cause color mixing and can thus improve the color reproducibility of the display device 10.

The color filters (CF1, CF2, and CF3) may be disposed in the emission areas (EA1, EA2, and EA3), respectively. The color filters (CF1, CF2, and CF3) may be disposed on the light-blocking layer BM, through which the opening holes (OPT1, OPT2, and OPT3) are defined or formed to correspond to the emission areas (EA1, EA2, and EA3), respectively. The opening holes (OPT1, OPT2, and OPT3) may be formed to overlap the emission areas (EA1, EA2, and EA3) and the openings (OPE1, OPE2, and OPE3) of the bank structure BNS and may form light-output areas that output light emitted by the emission areas (EA1, EA2, and EA3). The color filters (CF1, CF2, and CF3) may have a larger area than the opening holes (OPT1, OPT2, and OPT3) of the bank structure BNS and may completely cover the light-output areas formed by the opening holes (OPT1, OPT2, and OPT3).

The color filters (CF1, CF2, and CF3) may include first, second, and third color filters CF1, CF2, and CF3. The color filters (CF1, CF2, and CF3) may include a colorant such as a pigment or dye capable of absorbing all wavelengths of light except for a particular wavelength range and may be disposed to correspond to the colors of light emitted from the emission areas (EA1, EA2, and EA3). In an embodiment, for example, the first color filter CF1 may be disposed to overlap with the first emission area EA1 and may be a red color filter capable of transmitting only red light therethrough, the second color filter CF2 may be disposed to overlap the second emission area EA2 and may be a green color filter capable of transmitting only green light therethrough, and the third color filter CF3 may be disposed to overlap the third emission area EA3 and may be a blue color filter capable of transmitting only blue light therethrough. The color filters (CF1, CF2, and CF3) may be spaced apart from one another on the light-blocking layer BM. The color filters (CF1, CF2, and CF3) may have a larger area than the opening holes (OPT1, OPT2, and OPT3) of the light-blocking layer BM to cover the opening holes (OPT1, OPT2, and OPT3) of the light-blocking layer BM and to be spaced apart from one another on the light-blocking layer BM, but the disclosure is not limited thereto. The color filters (CF1, CF2, and CF3) may partially overlap one another. Different color filters (CF1, CF2, and CF3) may overlap one another on the light-blocking layer BM, which corresponds to an area not overlapping the emission areas (EA1, EA2, and EA3). As the color filters (CF1, CF2, and CF3) are disposed to overlap one another, the intensity of reflected light of external light can be reduced. Also, the color of reflected light of external light can be controlled by controlling the layout, the shape, and size of the color filters (CF1, CF2, and CF3).

The color filters (CF1, CF2, and CF3) of the color filter layer CFL may be disposed on the light-blocking layer BM. The color filters (CF1, CF2, and CF3) may be disposed to correspond to the emission areas (EA1, EA2, and EA3), the openings (OPE1, OPE2, and OPE3), and the opening holes (OPT1, OPT2, and OPT3), respectively. In an embodiment, for example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first opening hole OPT1 of the light-blocking layer BM, the second color filter CF2 may be disposed in the second opening hole OPT2 of the light-blocking layer BM, and the third color filter CF3 may be disposed in the third opening hole OPT3 of the light-blocking layer BM. The color filters (CF1, CF2, and CF3) may have a larger area than the opening holes (OPT1, OPT2, and OPT3) of the light-blocking layer BM, and parts of the color filters (CF1, CF2, and CF3) may be disposed directly on the light-blocking layer BM.

An overcoat layer OC may be disposed on the color filters (CF1, CF2, and CF3) may be disposed on the color filters (CF1, CF2, and CF3) and may planarize the tops of the color filters (CF1, CF2, and CF3). The overcoat layer OC may be a colorless light-transmitting layer not having a color in a visible wavelength range. In an embodiment, for example, the overcoat layer OC may include a colorless light-transmitting organic material such as an acrylic resin.

The fabrication of the display device 10 will hereinafter be described.

FIGS. 10 through 18 are cross-sectional views illustrating a method of fabricating a display device according to an embodiment of the disclosure.

FIGS. 10 through 18 illustrate a method of forming a bank structure BNS and light-emitting elements (ED1, ED2, and ED3) of a light-emitting element layer EML. Any repetitive detailed description of each of the layers of the display device 10 will be omitted, and instead, the order in which the layers of the display device 10 are formed will hereinafter be described.

Figure 10:
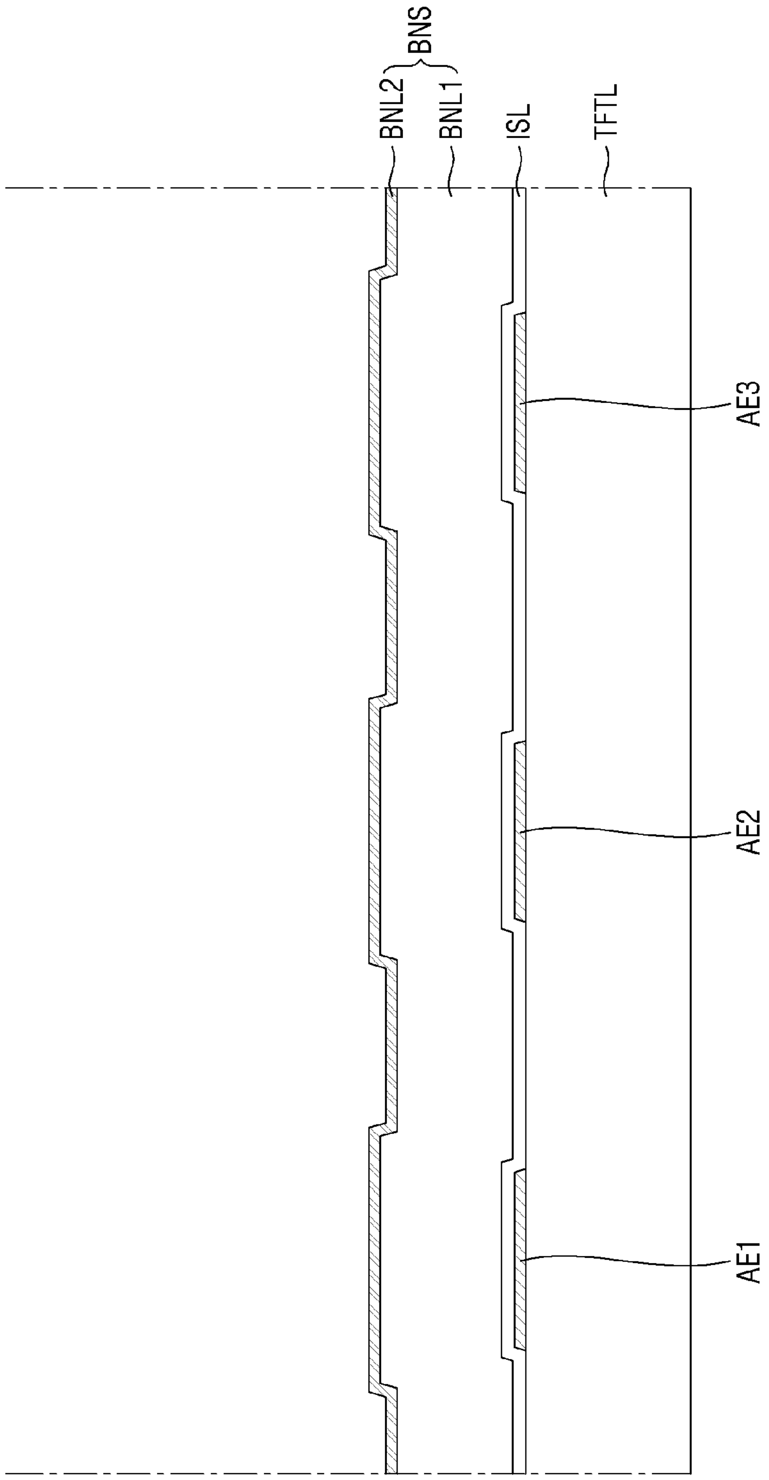
FIGS. 10 through 18 are cross-sectional views illustrating a method of fabricating a display device according to an embodiment of the disclosure.

Referring to FIG. 10, a plurality of pixel electrodes (AE1, AE2, and AE3), an inorganic insulating layer ISL, and first and second bank material layers BNL1 and BNL2 are formed on a TFT layer TFTL.

Although not specifically illustrated, the TFT layer TFTL may be disposed on a substrate SUB. The structure of the TFT layer TFTL is substantially the same as that described above with reference to FIG. 6, and thus, any repetitive detailed description thereof will be omitted.

The pixel electrodes (AE1, AE2, and AE3) may be spaced apart from one another on the TFT layer TFTL. The pixel electrodes (AE1, AE2, and AE3) may include first, second, and third pixel electrodes AE1, AE2, and AE3 of first, second, and third light-emitting elements ED1, ED2, and ED3, respectively. The first, second, and third pixel electrodes AE1, AE2, and AE3 may be spaced apart from one another on the TFT layer TFTL.

The inorganic insulating layer ISL and the first and second bank material layers BNL1 and BNL2 may be disposed on the pixel electrodes (AE1, AE2, and AE3). The inorganic insulating layer ISL may be disposed on the TFT layer TFTL to cover all the pixel electrodes (AE1, AE2, and AE3) and the entire TFT layer TFTL, and the first and second bank material layers BNL1 and BNL2 may be disposed to cover the entire inorganic insulating layer ISL. The first and second bank material layers BNL1 and BNL2 may be sequentially stacked on the inorganic insulating layer ISL. The first bank material layer BNL1 may be disposed directly on the inorganic insulating layer ISL, and the second bank material layer BNL2 may be disposed on the first bank material layer BNL1. The first and second bank material layers BNL1 and BNL2 may be partially etched in a subsequent process, thereby forming first and second bank layers BN1 and BN2 of the bank structure BNS. The first and second bank material layers BNL1 and BNL2 may include different metal materials from each other and may form the first and second bank layers BN1 and BN2, respectively.

Figure 11:
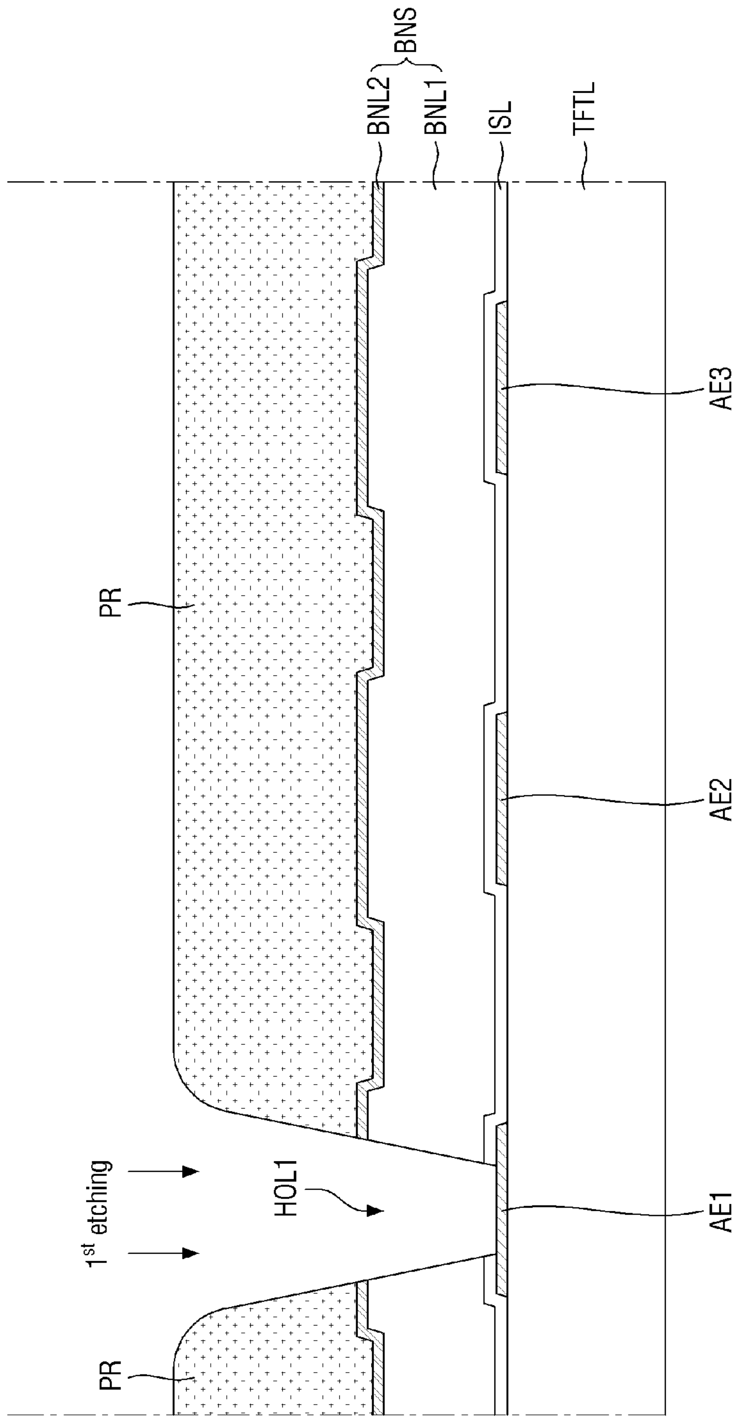

Thereafter, referring to FIG. 11, photoresist PR is formed on the first and second bank material layers BNL1 and BNL2, and a first etching process "1$^{st}$ etching", which etches parts of the first and second bank material layers BNL1 and BNL2, is performed using the photoresist PR as a mask, thereby forming a first hole HOL1.

The photoresist PR may be disposed on the first and second bank material layers BNL1 and BNL2 and may include patterns that are spaced apart from one another. The photoresist PR may not overlap the first pixel electrode AE1, on the second bank material layer BNL2, and may expose parts of the first and second bank material layers BNL1 and BNL2 that overlap the first pixel electrode AE1.

Dry etching may be performed as the first etching process "1$^{st}$ etching". As dry etching is performed as the first etching process "1$^{st}$ etching", the first and second bank material layers BNL1 and BNL2, which include different materials from each other, may be anisotropically etched. As the first and second bank material layers BNL1 and BNL2 and the inorganic insulating layer ISL are partially etched together, the first pixel electrode AE1 may be partially exposed. The first hole HOL1 may be formed in an area overlapping the first pixel electrode AE1 and may form a first opening OPE1 of the bank structure BNS.

During the fabrication of the display device 10, parts of the top surfaces of the pixel electrodes (AE1, AE2, and AE3) may be exposed by the first etching process "$1^{st}$ etching", and damaged regions may be formed on the exposed parts of the top surfaces of the pixel electrodes (AE1, AE2, and AE3). An auxiliary layer SPL may be disposed on parts of the pixel electrodes (AE1, AE2, and AE3) that are damaged by the first etching process "$1^{st}$ etching", and can prevent changes in the electrical properties of the pixel electrodes (AE1, AE2, and AE3).

Figure 12:
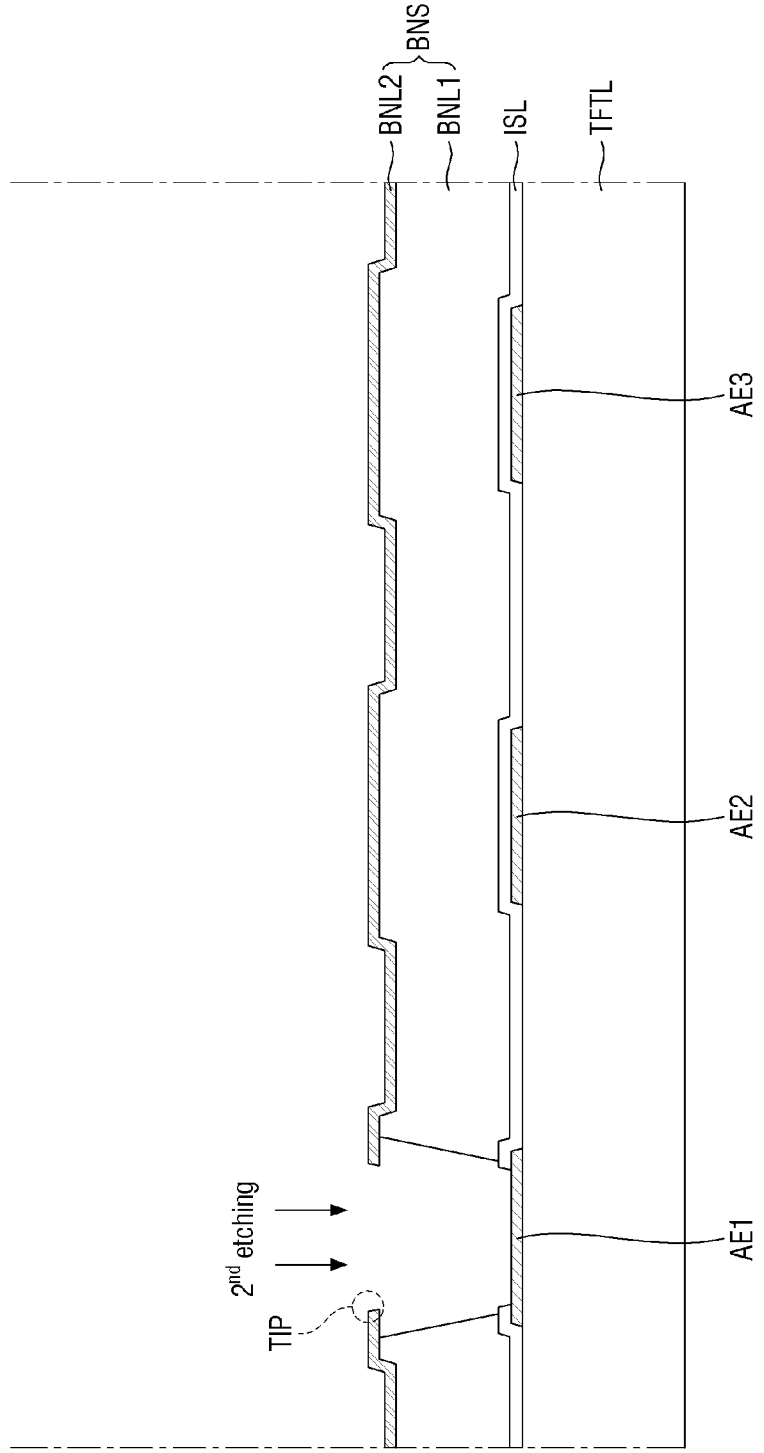

Thereafter, referring to FIG. 12, a second etching process "$2^{nd}$ etching", which etches parts of side surfaces of the first bank material layer BNL1, is performed. Wet etching may be performed as the second etching process "$2^{nd}$ etching". During the second etching process "$2^{nd}$ etching", the inner sidewall of the first hole HOL1 may be etched. The first bank material layer BNL1 may be etched faster than the second bank material layer BNL2, and tips TIP, which protrude beyond the side surfaces of the first bank material layer BNL1, may be formed in the second bank material layer BNL2. Undercuts may be formed on the side surfaces of the first bank material layer BNL1, below the tips TIP of the second bank material layer BNL2. As a result of the second etching process "$2^{nd}$ etching", the first hole HOL1 may form the first opening OPE1 or a first emission area EA1.

Figure 13:
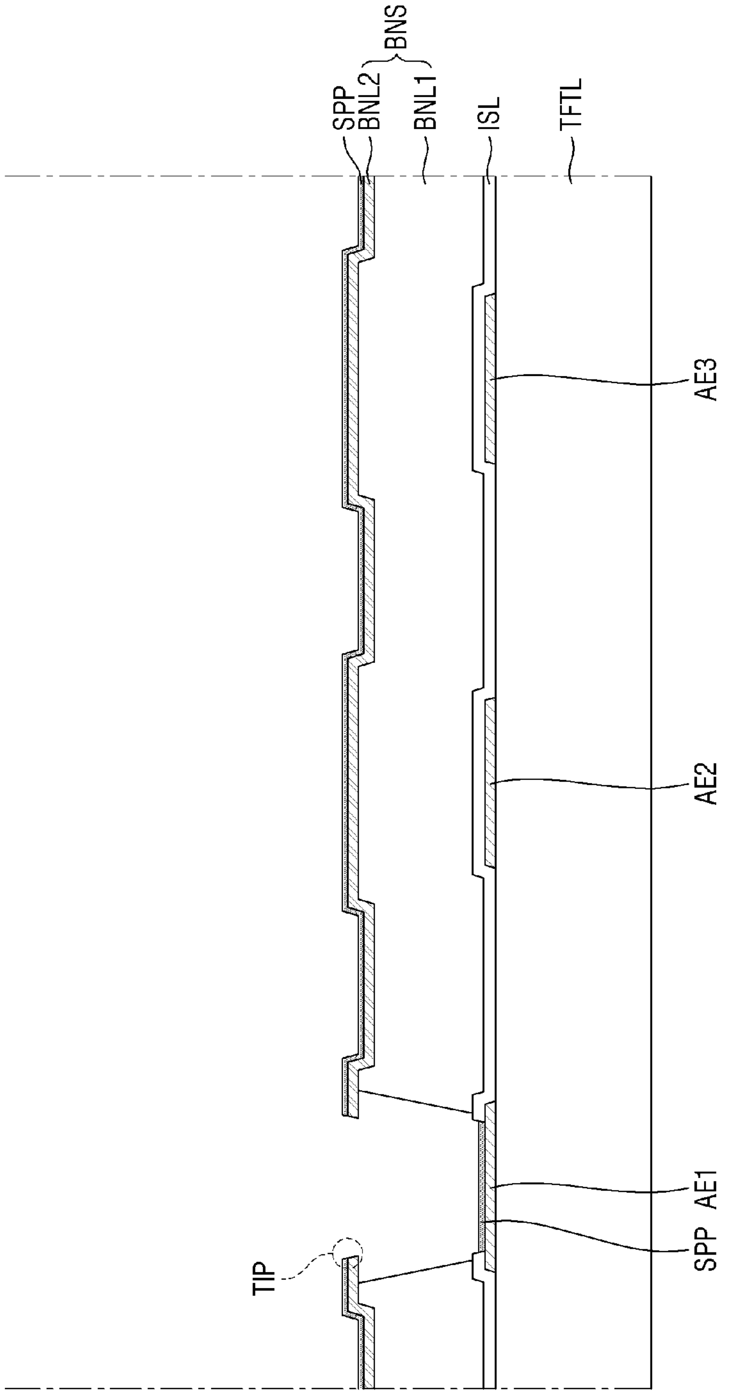

Thereafter, referring to FIG. 13, the auxiliary layer SPL and an auxiliary layer pattern SPP are formed on the first pixel electrode AE1 and the second bank material layer BNL2. The auxiliary layer SPL may be disposed on part of the first pixel electrode AE1 that is damaged by the first etching process "$1^{st}$ etching". The auxiliary layer SPL may be formed by a deposition process, and the auxiliary layer pattern SPP, which includes a same material as the auxiliary layer SPL, may be disposed on the second bank material layer BNL2.

In an embodiment, as described above, the auxiliary layer SPL may include $WO_x$ and $TaO_x$. As the auxiliary layer SPL includes a material having a high work function, but a low electrical conductivity, the auxiliary layer SPL can effectively prevent changes in the electrical properties of the pixel electrodes (AE1, AE2, and AE3) that may be caused by damage to the pixel electrodes (AE1, AE2, and AE3), and can also effectively prevent the pixel electrodes (AE1, AE2, and AE3) from being short-circuited.

In such an embodiment, as the auxiliary layer SPL, which can compensate for parts of the pixel electrodes (AE1, AE2, and AE3) that are damaged during the fabrication of the display device 10, is provided, a process of forming a sacrificial layer for preventing damage to the pixel electrodes (AE1, AE2, and AE3) and a structure that remains after the removal of the sacrificial layer can be omitted. As a result, changes in the properties of the pixel electrodes (AE1, AE2, and AE3) that may be caused by any remnants of the sacrificial layer on the pixel electrodes (AE1, AE2, and AE3) can be effectively prevented. In such an embodiment, as the inorganic insulating layer ISL can be disposed directly on the pixel electrodes (AE1, AE2, and AE3) and any gap between the inorganic insulating layer ISL and the pixel electrodes (AE1, AE2, and AE3) that may be formed by the sacrificial layer can be removed, tips may not be formed in the inorganic insulating layer ISL. Accordingly, layers disposed on the auxiliary layer can be effectively prevented from being disconnected by tips in the inorganic insulating layer ISL in subsequent deposition processes.

Figure 14:
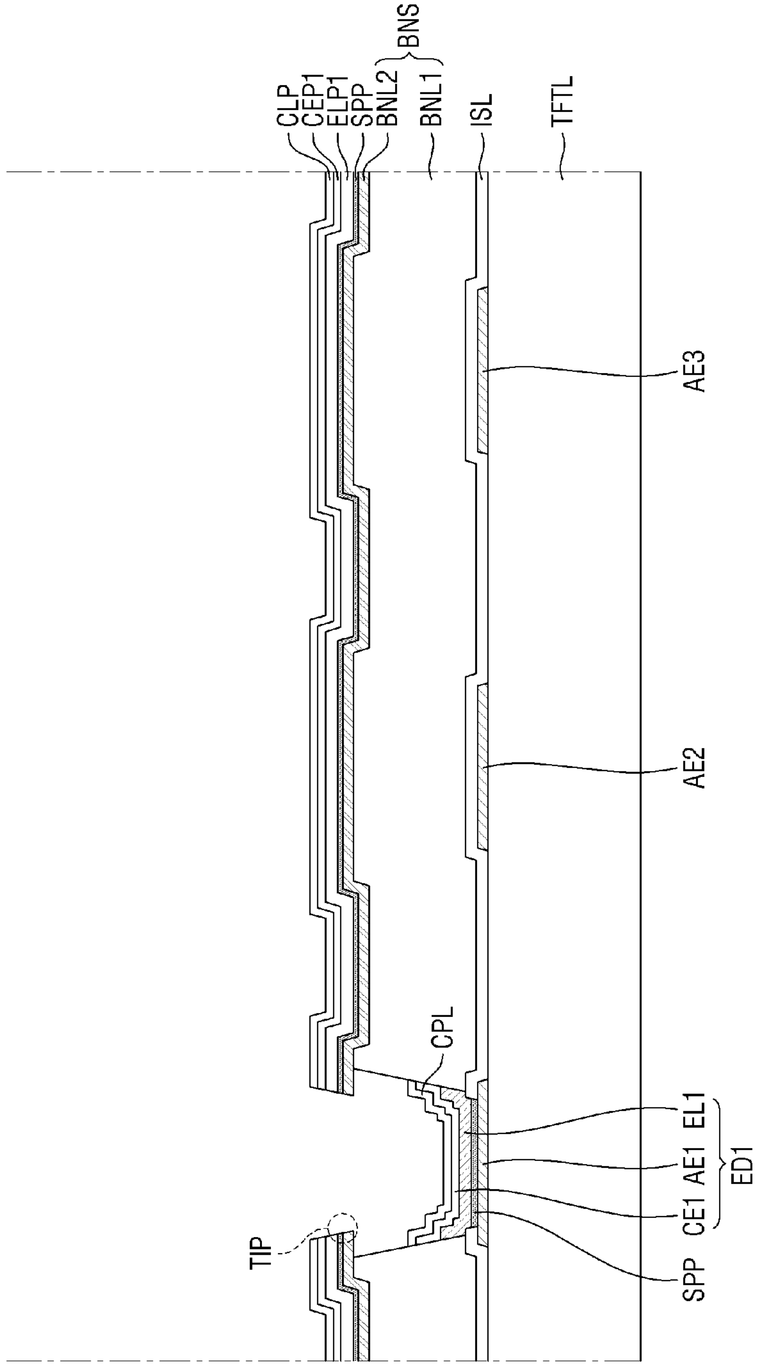

Thereafter, referring to FIG. 14, a first light-emitting layer EL1, a first common electrode CE1, and a capping layer CPL are deposited on the first pixel electrode AE1 and the auxiliary layer SPL, thereby forming a first light-emitting element ED1. The first light-emitting layer EL1 and the first common electrode CE1 may be formed in the first opening OPE1, and the materials of the first light-emitting layer EL1 and the first common electrode CE1 may also be deposited even on the second bank material layer BNL2, thereby forming a plurality of patterns. In an embodiment, for example, some of the materials of the first light-emitting layer EL1 and the first common electrode CE1 may be deposited on the second bank material layer BNL2, particularly, on the auxiliary layer pattern SPP, thereby forming a first organic pattern ELP1 and a first electrode pattern CEP1. Part of the capping layer CPL may be disposed in the first opening OPE1 to cover the first light-emitting element ED1, and another part of the capping layer CPL may be disposed on the second bank material layer BNL2 to cover the first organic pattern ELP1 and the first electrode pattern CEP1. The structures of the first light-emitting layer EL1, the first common electrode CE1, the first organic pattern ELP1, and the first electrode pattern CEP1 are substantially the same as those described above.

The first light-emitting layer EL1 and the first common electrode CE1 may be formed by deposition. The materials of the first light-emitting layer EL1 and the first common electrode CE1 may not be properly deposited due to the tips TIP of the second bank material layer BNL2. However, as the materials of the first light-emitting layer EL1 and the first common electrode CE1 are deposited diagonally, rather than perpendicularly, with respect to the top surface of the substrate SUB, the materials of the first light-emitting layer EL1 and the first common electrode CE1 can be deposited even in regions on the first bank material layer BNL1 that are hidden or covered by the tips TIP.

In an embodiment, for example, the deposition of the first light-emitting layer EL1 may be performed in a direction not perpendicular to the top surface of the first pixel electrode AE1, for example, at a first angle with respect to the top surface of the first pixel electrode AE1. The material of light-emitting layers (EL1, EL2, and EL3) may be deposited at an angle in a range of about 45° to about 50° with respect to the top surfaces of the pixel electrodes (AE1, AE2, and AE3). The first light-emitting layer EL1 may be formed to fill the space between the first pixel electrode AE1 and the inorganic insulating layer ISL and may be formed even in regions hidden by the tips TIP of the second bank material layer BNL2. In an embodiment, for example, the first light-emitting layer EL1 may be disposed on parts of the side surfaces of the first bank material layer BNL1, hidden by the tips TIP of the second bank material layer BNL2.

The deposition of the first common electrode CE1 may be performed in a direction not perpendicular to the top surface of the first pixel electrode AE1, for example, at a second angle with respect to the top surface of the first pixel electrode AE1. The material of common electrodes (CE1, CE2, and CE3) may be deposited at an angle of about 30° or less with respect to the top surfaces of the pixel electrodes (AE1, AE2, and AE3). The first common electrode CE1 may be disposed on the first light-emitting layer EL1 and may be formed even in regions hidden by the tips TIP of the second bank material layer BNL2. In an embodiment, for example, the first common electrode CE1 may be disposed on parts of the side surfaces of the first bank material layer BNL1, hidden by the tips TIP of the second bank material layer BNL2.

The deposition of the light-emitting layers (EL1, EL2, and EL3) may be performed more horizontally than the deposition of the common electrodes (CE1, CE2, and CE3). As a result, the contact areas of the common electrodes (CE1, CE2, and CE3) and the first bank material layer BNL1 (or the side surfaces of the first bank material layer BNL1) may be greater than the contact areas of the light-emitting layers (EL1, EL2, and EL3) and the first bank material layer BNL1 (or the side surfaces of the first bank material layer BNL1). Alternatively, the common electrodes (CE1, CE2, and CE3) may be deposited to a greater height than the light-emitting layers (EL1, EL2, and EL3), on the first bank material layer BNL1 (or the side surfaces of the first bank material layer BNL1). Different common electrodes (CE1, CE2, and CE3) may be in contact with the first bank material layer BNL1 or the first bank layer BN1, which has a high conductivity, and may thus be electrically connected to one another.

Figure 15:
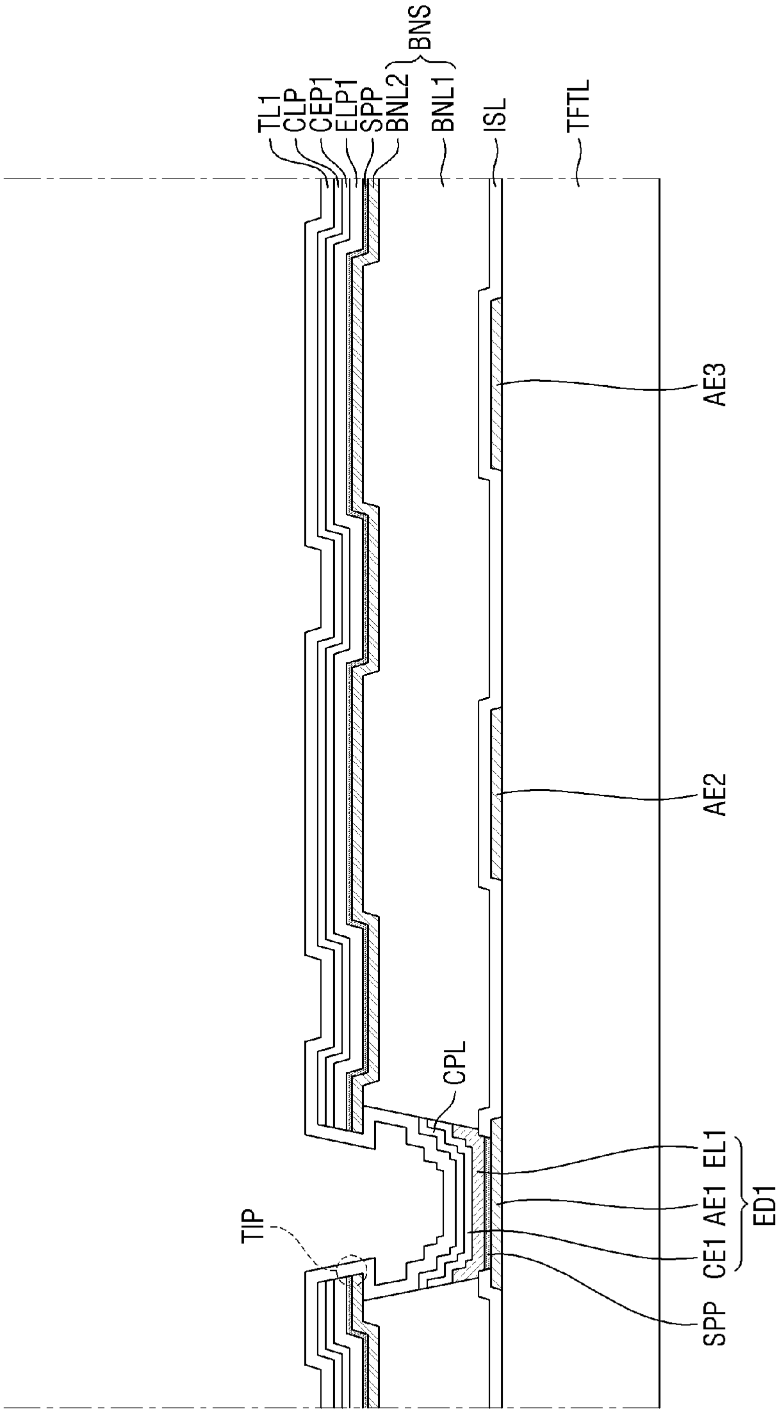

Thereafter, referring to FIG. 15, a first inorganic layer TL1, which covers the first light-emitting element ED1 and the capping layer CPL, is formed. The first inorganic layer TL1, unlike the light-emitting layers (EL1, EL2, and EL3) and the common electrodes (CE1, CE2, and CE3), may be formed by CVD and may have a uniform thickness regardless of the underlying step differences. The first inorganic layer TL1 may be formed to completely cover the first light-emitting element ED1, the first and second bank material layers BNL1 and BNL2, and the capping layer CPL. The first inorganic layer TL1 may be deposited even below the tips TIP of the second bank material layer BNL2.

Figure 16:
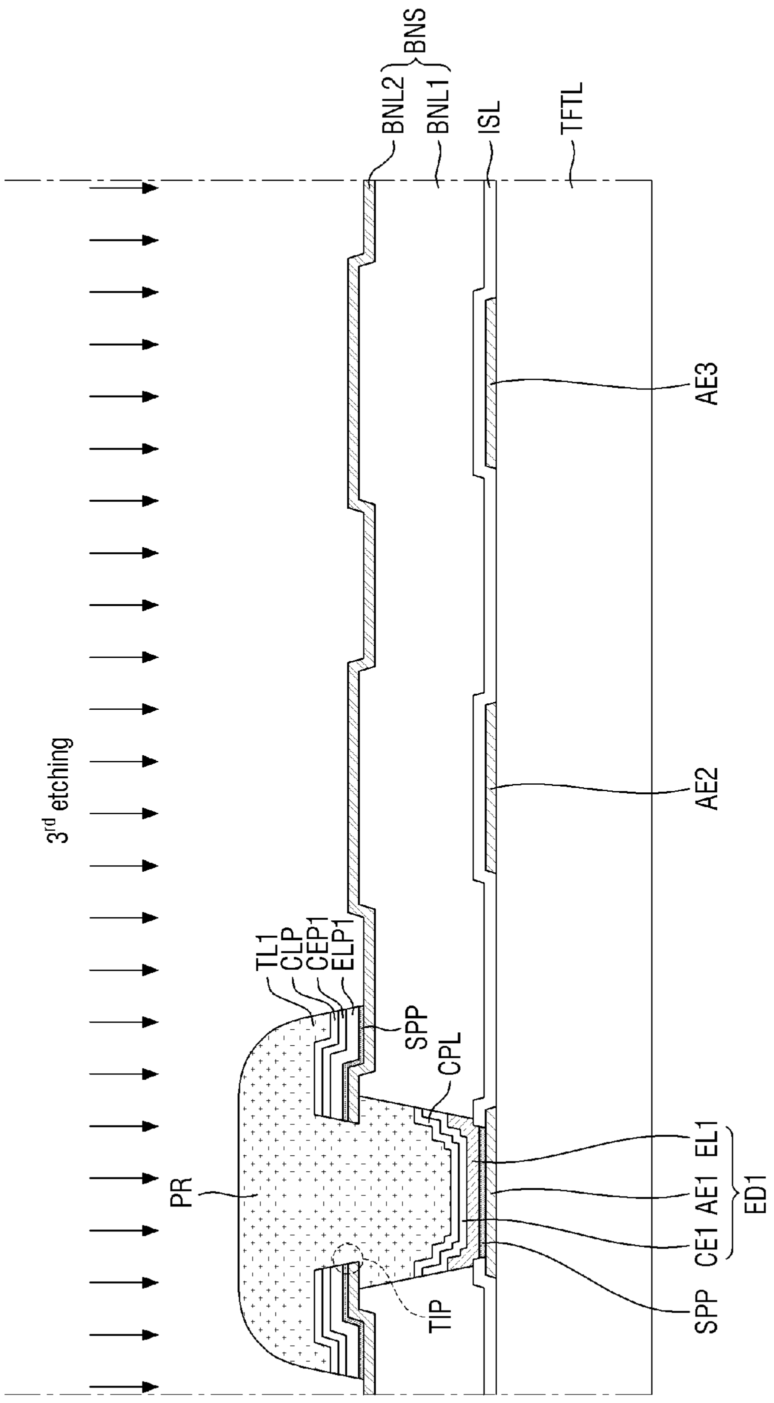

Thereafter, referring to FIG. 16, photoresist PR is formed on the first inorganic layer TL1, and a third etching process "$3^{rd}$ etching", which removes parts of the first organic pattern ELP1, the first electrode pattern CEP1, the capping layer CPL, and the first inorganic layer TL1 on the first and second bank material layers BNL1 and BNL2, is performed.

The photoresist PR may be disposed to overlap the first opening OPE1 or the first light-emitting element ED1. The entire auxiliary layer pattern SPP, the entire first organic pattern ELP1, the entire first electrode pattern CEP1, an entire capping pattern CLP, and the entire first inorganic layer TL1 except for parts thereof around the first opening OPE1 or the first light-emitting element ED1 may be removed. The entire second bank material layer BNL2 except for part thereof around the first opening OPE1 or the first light-emitting element ED1 may be exposed.

Dry etching using a fluorine (F)-based etchant may be performed as the third etching process "$3^{rd}$ etching", which removes part of the first inorganic layer TL1 on the first and second bank material layers BNL1 and BNL2.

In this manner, a first light-emitting element ED1 and a first inorganic layer TL1 covering the first light-emitting element ED1, the first organic pattern ELP1, the first electrode pattern CEP1, and the capping layer CPL may be obtained.

Figure 17:
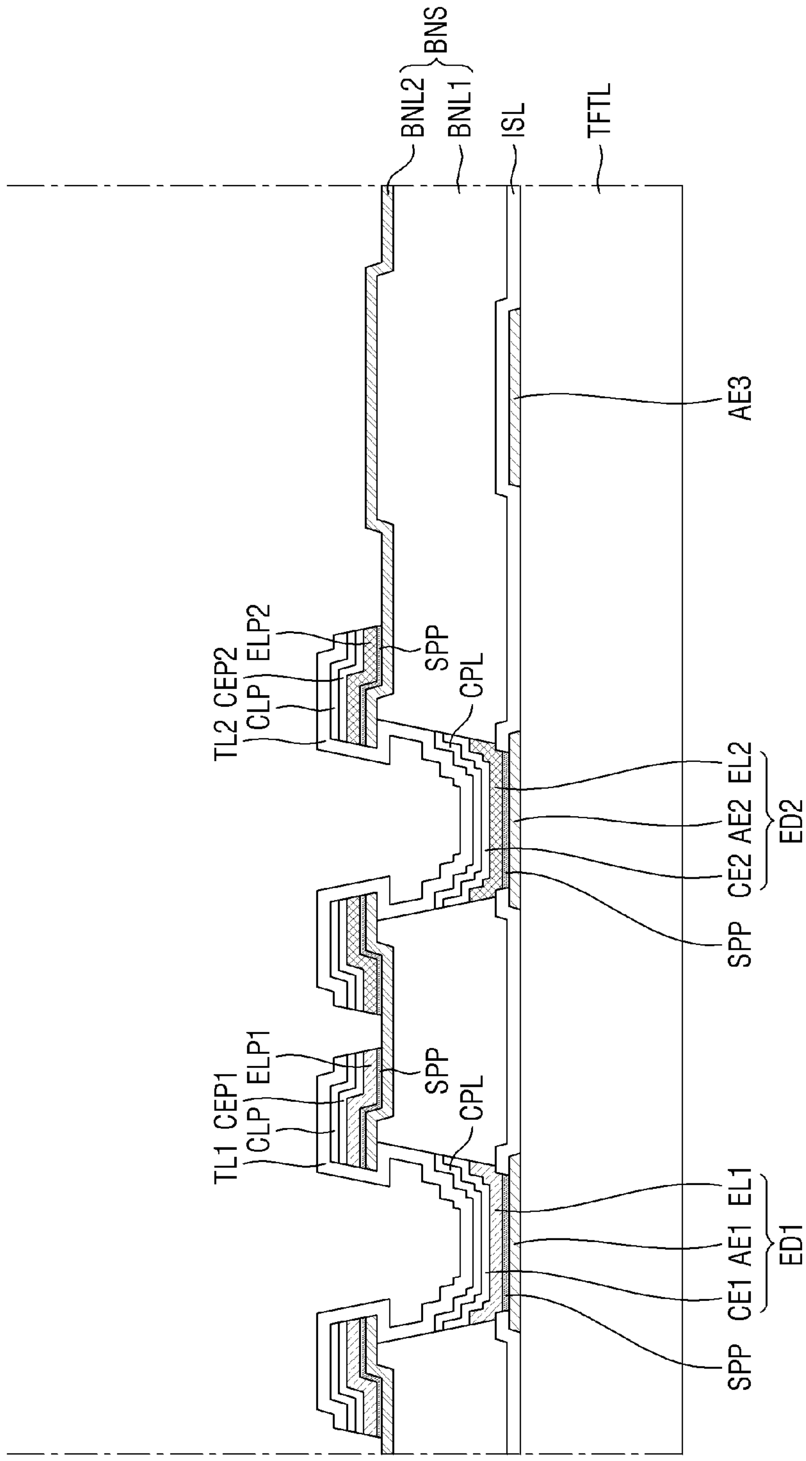
Figure 18:
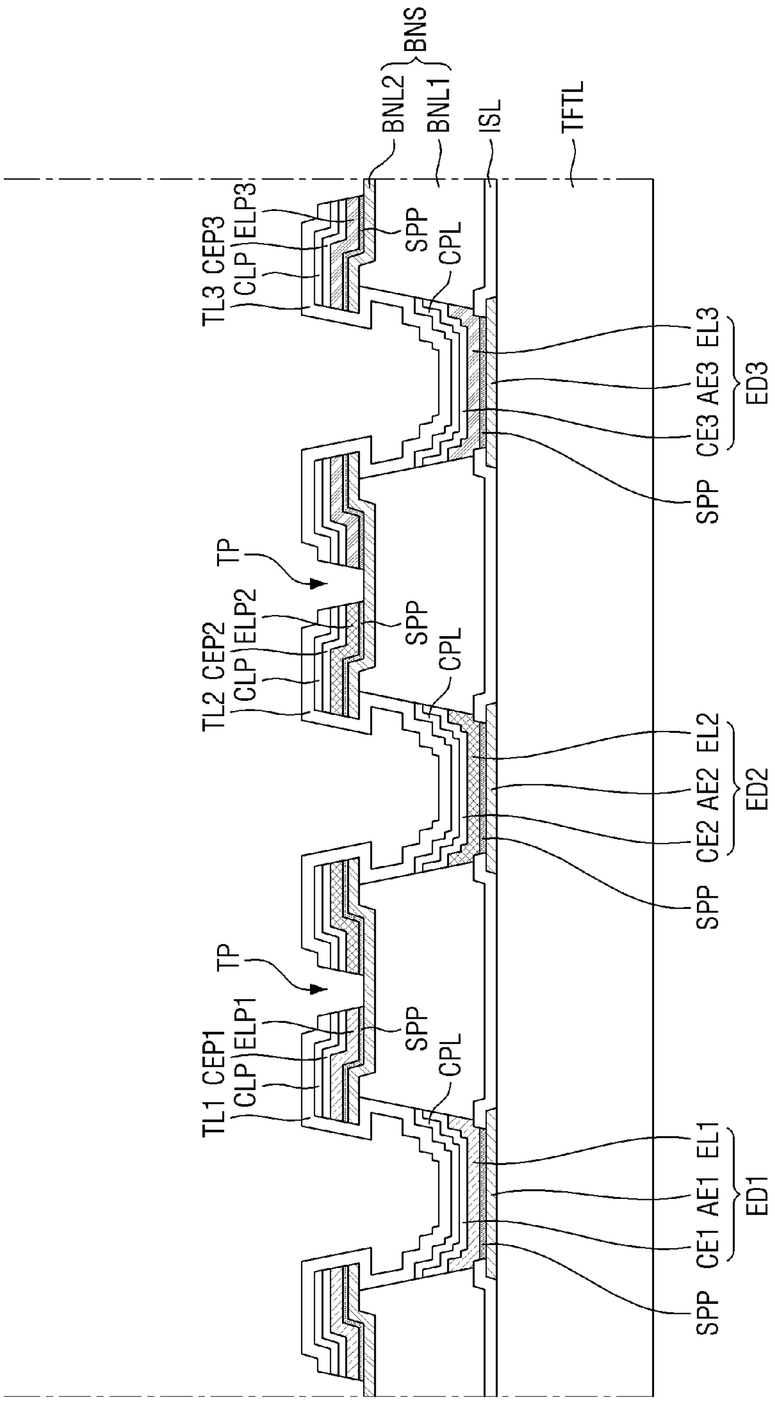

Referring to FIGS. 17 and 18, a second light-emitting element ED2, a third light-emitting element ED3, a second inorganic layer TL2, and a third inorganic layer TL3 may be formed by repeatedly performing processes similar to the processes for forming the first light-emitting element ED1 and the first inorganic layer TL1.

Thereafter, although not specifically illustrated, second and third encapsulation layers TFE2 and TFE2 are formed on a first encapsulation layer TFE1 and the bank structure BNS, and a touch sensing layer TSU, a light-blocking layer BM, a color filter layer CFL, and an overcoat layer OC are formed, thereby obtaining the display device 10.

Display devices according to alternative embodiments of the disclosure will hereinafter be described.

Figure 19:
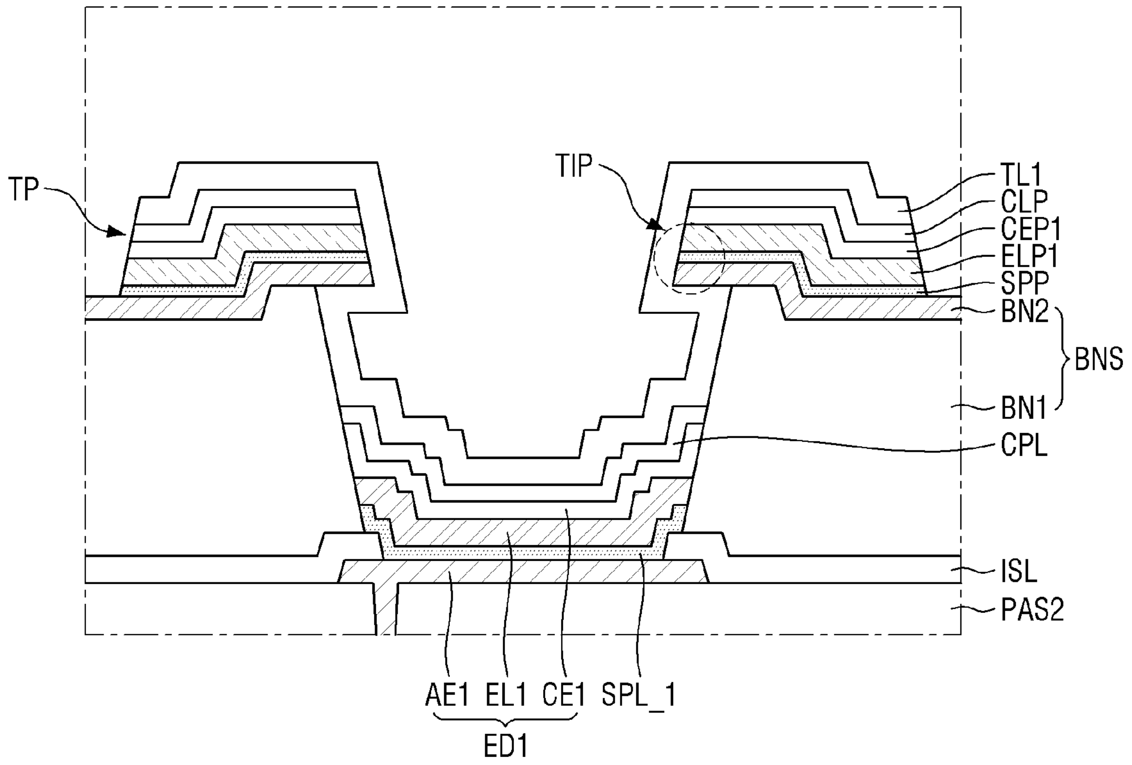
FIGS. 19 and 20 are cross-sectional views of emission areas of display devices according to alternative embodiments of the disclosure.
Figure 20:
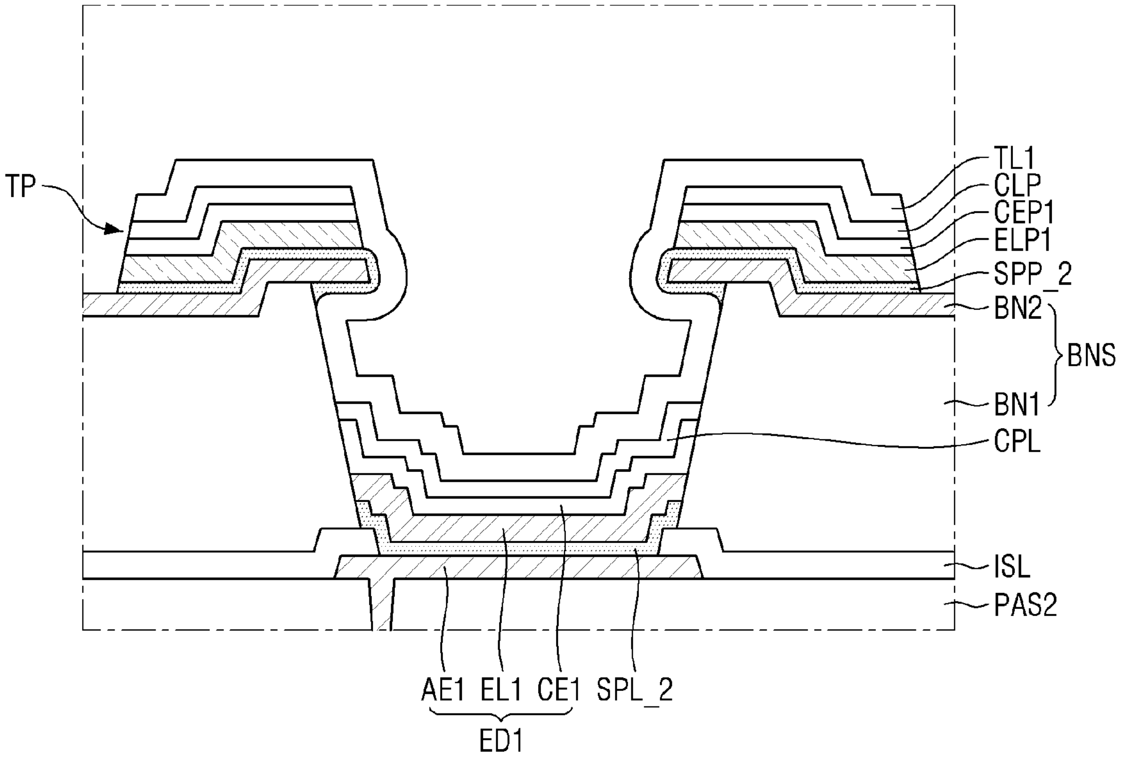

FIGS. 19 and 20 are cross-sectional views of emission areas of display devices according to alternative embodiments of the disclosure.

Referring to FIG. 19, in an alternative embodiment, an auxiliary layer SPL_1 may be disposed in part on an inorganic insulating layer ISL and may be in contact with side surfaces of a first bank layer BN1 of a bank structure BNS. The embodiment of FIG. 19 is substantially the same as the embodiment of FIG. 7 except that the auxiliary layer SPL_1 is partially in contact with the first bank layer BN1.

The auxiliary layer SPL1 may be formed after removing part of the inorganic insulating layer ISL to expose part of the top surface of a first pixel electrode AE1. The auxiliary layer SPL_1 may be disposed not only on the exposed part of the top surface of the first pixel electrode AE1, but also on the inorganic insulating layer ISL and may thus be in contact with the side surfaces of the first bank layer BN1.

In such an embodiment, as described above, the auxiliary layer SPL_1 may include $WO_x$ and $TaO_x$ and may thus have a high work function, but a low electrical conductivity. As a result, even though the auxiliary layer SPL_1 is in contact with the side surfaces of the first bank layer BN1, the first pixel electrode AE1 may not be able to be short-circuited with other pixel electrodes via the auxiliary layer SPL_1 and the first bank layer BN1. The auxiliary layer SPL_1 can function as a hole injection layer between the first pixel electrode AE1 and a first light-emitting layer EL1 even when being in contact with the side surfaces of the first bank layer BN1.

Referring to FIG. 20, in another alternative embodiment, an auxiliary layer pattern SPP_2 may be disposed to surround a tip of a bank structure BNS and may be partially in contact with side surfaces of a first bank layer BN1 of the bank structure BNS. The embodiment of FIG. is substantially the same as the embodiment of FIG. 19 except that the auxiliary layer pattern SPP_2 is partially in contact with the first bank layer BN1.

An auxiliary layer SPL_2 may be formed after removing part of an inorganic insulating layer ISL to expose part of the top surface of a first pixel electrode AE1. The structure of the auxiliary layer SPL_2 may vary depending on the structure of the auxiliary layer pattern SPP_2 on the bank structure BNS. The auxiliary layer pattern SPP_2 may be disposed to surround a tip of the bank structure BNS and may be disposed in part below the tip of a second bank layer BN2. The auxiliary layer pattern SPP_2 may be in contact with side surfaces of the first bank layer BN1.

In such an embodiment, as described above, the auxiliary layer SPL_2 may include $WO_x$ and $TaO_x$ and may thus have a high work function, but a low electrical conductivity. The auxiliary layer pattern SPP_2 may include a same material as the auxiliary layer SPL_2. Thus, even though the auxiliary layer pattern SPP_2 is in contact with the side surfaces of the first bank layer BN1, a light-emitting element ED1 can be effectively prevented from being short-circuited with other light-emitting elements.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a first pixel electrode and a second pixel electrode which are disposed on a substrate to be spaced apart from each other;

an inorganic insulating layer disposed on the substrate to be in part on the first and second pixel electrodes;

a bank structure disposed on the inorganic insulating layer, wherein first and second openings are defined through the bank structure to overlap the first and second pixel electrodes, respectively;

an auxiliary layer disposed on the first and second pixel electrodes in the first and second openings;

a first light-emitting layer and a second light-emitting layer which are disposed on the auxiliary layer on the first pixel electrode and the second pixel electrode, respectively;

a first common electrode and a second common electrode which are disposed on the first light-emitting layer and the second light-emitting layer, respectively; and an auxiliary layer pattern disposed on the bank structure around the first opening and the second opening, wherein the first common electrode and the second common electrode are spaced apart from each other, the bank structure includes a first bank layer and a second bank layer, which is disposed on the first bank layer and includes a different metal material from the first bank layer, and the second bank layer includes tips, which protrude from side surfaces of the first bank layer defining the first opening and the second opening.

2. The display device of claim 1, wherein each of the auxiliary layer and the auxiliary layer pattern includes tungsten oxide ($WO_x$).

3. The display device of claim 2, wherein each of the auxiliary layer and the auxiliary layer pattern includes tantalum oxide ($TaO_x$).

4. The display device of claim 3, wherein each of the auxiliary layer and the auxiliary layer pattern have a $TaO_x$ content in a range of about 5 wt % to about 12 wt %.

5. The display device of claim 2, wherein each of the auxiliary layer and the auxiliary layer pattern do not include indium tin oxide (ITO).

6. The display device of claim 1, wherein the auxiliary layer is in contact with top surfaces of the first pixel electrode and the second pixel electrode.

7. The display device of claim 1, wherein the auxiliary layer is disposed at least in part on the inorganic insulating layer and is partially in contact with the side surfaces of the first bank layer.

8. The display device of claim 1, wherein the auxiliary layer pattern is disposed to surround the tips of the second bank layer and is at least partially in contact with the side surfaces of the first bank layer.

9. The display device of claim 1, wherein the first bank layer includes aluminum (Al), and the second bank layer includes titanium (Ti).

10. The display device of claim 1, wherein the first common electrode and the second common electrode are in direct contact with the side surfaces of the first bank layer.

11. The display device of claim 1, further comprising:

a first organic pattern disposed on the auxiliary layer pattern to surround the first opening and including a same material as the first light-emitting layer;

a first electrode pattern disposed on the first organic pattern and including a same material as the first common electrode;

a second organic pattern disposed on the auxiliary layer pattern to surround the second opening and including a same material as the second light-emitting layer; and a second electrode pattern disposed on the second organic pattern and including a same material as the second common electrode.

12. The display device of claim 11, further comprising:

a first inorganic layer disposed on a side surface of the bank structure defining the first opening and on the first common electrode and the first electrode pattern; and a second inorganic layer disposed on a side surface of the second opening and on the second common electrode and the second electrode pattern, wherein the first and second inorganic layers are spaced apart from each other, and part of the second bank layer does not overlap the first and second inorganic layers.

13. The display device of claim 1, further comprising:

a thin-film encapsulation layer disposed on the bank structure, wherein the thin-film encapsulation layer includes a first encapsulation layer, a second encapsulation layer, which is disposed on the first encapsulation layer, and a third encapsulation layer, which is disposed on the second encapsulation layer.

14. The display device of claim 13, further comprising:

a light-blocking layer disposed on the third encapsulation layer, wherein a plurality of opening holes is defined through the light-blocking layer to overlap the first opening and the second opening, and a first color filter and a second color filter which are disposed on the light-blocking layer and overlap the first opening and the second opening, respectively.

* * * * *